(12) United States Patent
Nakamura et al.

(10) Patent No.: US 8,704,127 B2
(45) Date of Patent: Apr. 22, 2014

(54) METHOD OF FORMING A THROUGH HOLE BY LASER DRILLING

(75) Inventors: Susumu Nakamura, Niigata (JP); Kaoru Itagaki, Niigata (JP)

(73) Assignee: Wavelock Advanced Technology Co., Ltd., Tokyo (JP)

(*) Notice: Subject to any disclaimer, the term of this patent is extended or adjusted under 35 U.S.C. 154(b) by 667 days.

(21) Appl. No.: 12/919,630

(22) PCT Filed: Mar. 2, 2009

(86) PCT No.: PCT/JP2009/053897
§ 371 (c)(1),
(2), (4) Date: Aug. 26, 2010

(87) PCT Pub. No.: WO2009/107837
PCT Pub. Date: Sep. 3, 2009

(65) Prior Publication Data
US 2011/0003114 A1 Jan. 6, 2011

(30) Foreign Application Priority Data

Feb. 28, 2008 (JP) ................................ 2008-047836
Aug. 19, 2008 (JP) ................................ 2008-210680

(51) Int. Cl.
*B23K 26/38* (2014.01)
(52) U.S. Cl.
USPC ................................................... 219/121.71
(58) Field of Classification Search
USPC ........................................................ 219/121.71
See application file for complete search history.

(56) References Cited

U.S. PATENT DOCUMENTS

| 4,857,698 A * | 8/1989 | Perun ................... 219/121.71 |
| 4,873,414 A * | 10/1989 | Ma et al. ................ 219/121.71 |
| 6,172,331 B1 * | 1/2001 | Chen .................... 219/121.71 |
| 6,433,301 B1 * | 8/2002 | Dunsky et al. ........... 219/121.67 |

(Continued)

FOREIGN PATENT DOCUMENTS

| EP | 0719638 | 7/1996 |
| JP | 8-141766 | 6/1996 |

(Continued)

OTHER PUBLICATIONS

Office Action issued by the Korean Patent Office in corresponding application No. 10-2010-7021112 dated Jun. 1, 2012 with English translation (8 pages).

(Continued)

*Primary Examiner* — Geoffrey S Evans
(74) *Attorney, Agent, or Firm* — Kratz, Quintos & Hanson, LLP

(57) ABSTRACT

A method for forming a through hole, which resolves many problems of conventional method for forming a through hole by applying laser beam and can easily control a shape of the through hole so as to form even diameters at a laser incident side and an opposite side without dependence on a shape of a work object, and form a counter-tapered hole with a diameter at the opposite side larger than that at the incident side, is provided. In the method based on a laser ablation method for forming a through hole, the laser beam is applied on a laser beam exit surface of the work object to be in contact with at least one of a colloid solution of a high-polymer material, a solution of a high-polymer material or polyol.

9 Claims, 22 Drawing Sheets

(56) References Cited

U.S. PATENT DOCUMENTS

| | | | |
|---|---|---|---|
| 6,723,951 B1* | 4/2004 | McGraw | 219/121.71 |
| 2003/0180569 A1* | 9/2003 | Hamann et al. | 219/121.71 |
| 2005/0029238 A1* | 2/2005 | Chen | 219/121.71 |
| 2006/0246279 A1* | 11/2006 | Urairi et al. | 428/345 |
| 2009/0123740 A1* | 5/2009 | Hanaki et al. | 428/337 |
| 2009/0261084 A1* | 10/2009 | Wakayama et al. | 219/121.85 |

FOREIGN PATENT DOCUMENTS

| | | |
|---|---|---|
| JP | 11-58051 | 3/1999 |
| JP | 2000-094163 | 4/2000 |
| JP | 2001-79677 A1 | 3/2001 |
| JP | 2001-212965 A1 | 8/2001 |
| JP | 2003-158358 A1 | 5/2003 |
| JP | 2004-042082 | 2/2004 |
| JP | 2004-42082 A1 | 2/2004 |
| JP | 2004-243404 A1 | 9/2004 |
| WO | 2007/001078 | 1/2007 |

OTHER PUBLICATIONS

International Search Report for International Application No. PCT/JP2009/053897 dated May 15, 2009.
Extended European Search Report issued in counterpart application No. 09714475.2 dated Nov. 5, 2012 (5 pages).

* cited by examiner

TRANSPARENT PET SHEET T=48 μm
YAG WAVELENGTH 266nm, PULSE WIDTH 4-6ns, ENERGY-10 μJ, TIMES OF IRRADIATION, 105 TIMES/HOLE, HOLE PITCH 24 μm, f=50mm

|  | APPLICATION OF PVA AQUEOUS SOLUTION | DRYING AFTER APPLICATION | NO APPLICATION |
|---|---|---|---|
| EXIT PLANE |  AVERAGE DIAMETER 17.77 μm |  AVERAGE DIAMETER 14.60 μm |  AVERAGE DIAMETER 13.84 μm |
| INCIDENCE PLANE |  AVERAGE DIAMETER 20.67 μm |  AVERAGE DIAMETER 20.79 μm |  AVERAGE DIAMETER 20.73 μm |

| | PVA GLUE APPLIED | PVA GLUE NOT APPLIED |
|---|---|---|
| EXIT PLANE |  AVERAGE DIAMETER 29.4 μm |  AVERAGE DIAMETER 16.9 μm |
| INCIDENCE PLANE |  AVERAGE DIAMETER 29.6 μm |  AVERAGE DIAMETER 29.1 μm |

| | PVA GLUE APPLIED | PVA GLUE NOT APPLIED |
|---|---|---|
| EXIT PLANE |  AVERAGE DIAMETER 55.99 μm |  AVERAGE DIAMETER 21.19 μm |
| INCIDENCE PLANE |  AVERAGE DIAMETER 47.96 μm |  AVERAGE DIAMETER 45.39 μm |

FIG. 9

| | AIR (OPEN) | PVA | VINYL ACETATE | CELLULOSE |
|---|---|---|---|---|
| EXIT PLANE | AVERAGE DIAMETER 22.77 μm | AVERAGE DIAMETER 46.01 μm | AVERAGE DIAMETER 35.61 μm | AVERAGE DIAMETER 37.57 μm |
| INCIDENCE PLANE | AVERAGE DIAMETER 44.18 μm | AVERAGE DIAMETER 45.67 μm | AVERAGE DIAMETER 47.66 μm | AVERAGE DIAMETER 49.32 μm |
| EXIT DIAMETER/ INCIDENCE DIAMETER | 0.52 | 1.01 | 0.75 | 0.76 |

FIG. 10

| | AIR (OPEN) | PVA | VINYL ACETATE | CELLULOSE |
|---|---|---|---|---|
| EXIT PLANE | AVERAGE DIAMETER 19.36 μm | AVERAGE DIAMETER 30.84 μm | AVERAGE DIAMETER 38.10 μm | AVERAGE DIAMETER 26.92 μm |
| INCIDENCE PLANE | AVERAGE DIAMETER 38.97 μm | AVERAGE DIAMETER 40.29 μm | AVERAGE DIAMETER 40.53 μm | AVERAGE DIAMETER 38.77 μm |
| EXIT DIAMETER/ INCIDENCE DIAMETER | 0.50 | 0.77 | 0.94 | 0.69 |

| | PVA GLUE APPLIED | PVA GLUE NOT APPLIED |
|---|---|---|
| EXIT PLANE |  REPRESENTATIVE DIAMETER $-\mu m$ |  REPRESENTATIVE DIAMETER $-\mu m$ |
| INCIDENCE PLANE |  REPRESENTATIVE DIAMETER $24.42\ \mu m$ |  REPRESENTATIVE DIAMETER $30.87\ \mu m$ |

| | PVA GLUE APPLIED | PVA GLUE NOT APPLIED |
|---|---|---|
| EXIT PLANE |  REPRESENTATIVE DIAMETER 22.35 μm |  REPRESENTATIVE DIAMETER 23.80 μm |
| INCIDENCE PLANE |  REPRESENTATIVE DIAMETER 86.84 μm |  REPRESENTATIVE DIAMETER 88.35 μm |

FIG. 13

| | NO APPLICATION | BENZIN | TAP WATER |
|---|---|---|---|
| INCIDENCE PLANE | 38.4 μm | 44.0 μm | 47.7 μm |
| EXIT PLANE | 7.6 μm | 14.2 μm | 28.7 μm |
| RATIO | 0.20 | 0.32 | 0.60 |

FIG. 14

| | ETHANOL | ETHANOL AQUEOUS SOLUTION (ETHANOL 1 : TAP WATER 1) | METHANOL | METHANOL AQUEOUS SOLUTION (METHANOL 1 : TAP WATER 1) |
|---|---|---|---|---|
| INCIDENCE PLANE | 42.9 μm | 48.4 μm | 43.1 μm | 49.0 μm |
| EXIT PLANE | 23.1 μm | 28.2 μm | 25.0 μm | 28.1 μm |
| RATIO | 0.54 | 0.58 | 0.58 | 0.57 |

FIG. 15

| | GLYCERIN | GLYCERIN AQUEOUS SOLUTION (GLYCERIN 2:TAP WATER 1) | PVA | PVA AQUEOUS SOLUTION (PVA 1:TAP WATER 5) |
|---|---|---|---|---|
| INCIDENCE PLANE | 36.6 μm | 49.5 μm | 38.1 μm | 47.2 μm |
| EXIT PLANE | 47.6 μm | 35.21 μm | 42.0 μm | 37.4 μm |
| RATIO | 1.30 | 0.71 | 1.10 | 0.79 |

| | CM CELLULOSE AQUEOUS SOLUTION | HYDROGEN PEROXIDE SOLUTION |
|---|---|---|
| INCIDENCE PLANE | <br>45.6 μm | <br>45.4 μm |
| EXIT PLANE | <br>41.4 μm | <br>27.1 μm |
| RATIO | 0.91 | 0.60 |

FIG. 17

| | NO APPLICATION | ETHYLENE GLYCOL | DIGLYCEROL | POLYGLYCEROL | METHANOL |
|---|---|---|---|---|---|
| INCIDENCE PLANE | 35.5 μm | 65.0 μm | 54.5 μm | 30.7 μm | 58.3 μm |
| EXIT PLANE | 10.0 μm | 45.5 μm | 49.4 μm | 37.3 μm | 31.8 μm |
| RATIO | 0.28 | 0.70 | 0.91 | 1.21 | 0.55 |

| | NO APPLICATION | ETHYLENE GLYCOL | DIGLYCEROL | POLYGLYCEROL |
|---|---|---|---|---|
| INCIDENCE PLANE | 45.4 μm | 44.8 μm | 44.0 μm | 42.4 μm |
| EXIT PLANE | 22.0 μm | 36.4 μm | 60.8 μm | 67.1 μm |
| RATIO | 0.49 | 0.81 | 1.38 | 1.58 |

FIG. 20

| | NO APPLICATION | ETHYLENE GLYCOL | DIGLYCEROL | POLYGLYCEROL |
|---|---|---|---|---|
| INCIDENCE PLANE | 46.5 μm | 40.8 μm | 46.8 μm | 42.5 μm |
| EXIT PLANE | 25.7 μm | 33.1 μm | 54.2 μm | 62.8 μm |
| RATIO | 0.55 | 0.81 | 1.16 | 1.48 |

FIG. 23

| | NO APPLICATION | TAP WATER | STARCH GLUE | CM CELLULOSE SODIUM (CONCENTRATION: 5%) |
|---|---|---|---|---|
| INCIDENCE PLANE | 30.9 μm | 45.6 μm | 30.8 μm | 32.6 μm |
| EXIT PLANE | 8.0 μm | 14.4 μm | 28.8 μm | 34.6 μm |
| RATIO | 0.26 | 0.32 | 0.94 | 1.06 |

METHOD OF FORMING A THROUGH HOLE BY LASER DRILLING

TECHNICAL FIELD

The present invention relates to a through hole forming method using a laser beam. More specifically, the present invention relates to a through hole forming method based on a laser ablation processing method.

BACKGROUND ART

Resin materials have become widespread in all kinds of products from industrial products to domestic articles, various kinds of processing are applied to each resin material to provide its own function, and a high processing accuracy is demanded. However, as pore processing with respect to a resin, there are drilling, press working, electron beam machining, etching processing and others, but forming a through hole having a hole diameter that is not greater than a material thickness and forming a through hole at a hole pitch that is not greater than a material thickness are difficult.

An application field of a laser processing application technology has spread to cutting/boring/welding using a $CO_2$ laser, precise cutting/boring/welding using a YAG laser, marking, removal of a thin film by using an excimer laser and high-polymer material processing, and this technology is also applied to the above-described resin material processing field.

Here, when a hole is formed in an article made of a resin material by using a $CO_2$ laser which is an infrared light, there occurs a problem that processing with a fine hole quality cannot be performed because of a raise formed around the through hole due to a thermal influence or attachment of an ejection or that holes adjacent to each other are connected if a hole pitch is too narrow, thus disabling hole processing with a high density.

At the present day, practical application of a machining process using an UV light source such as a third harmonic/fourth harmonic of a YAG laser has advanced, and development utilizing an ablation phenomenon that chemical bond in constituent molecules of a high-polymer material is cut based on photon energy by using a laser having a wavelength in a UV region and a portion irradiated with a laser beam is instantaneously decomposed and scattered is in progress.

Processing utilizing this ablation phenomenon has many merits, e.g., enabling precision processing with less thermal influence because of a small thermal diffusion amount with respect to a peripheral portion, eliminating the need for post-processing or finish processing and others, and hence use of this processing is rapidly spreading.

However, in the hole forming processing of forming a through hole in a processing target (work object), there has been reported that a diameter of a formed through hole on a laser beam exit side of the processing target is smaller than that on a laser beam incidence side, i.e., the hole is formed in a so-called tapered shape because of characteristics of the laser beam.

Therefore, formation of a through hole having a larger diameter or formation of more through holes is required to obtain a sufficient opening area and, at this time, there occurs a problem, e.g., a reduction in mechanical strength of a processed portion, a reduction in processing efficiency, an increase in processing cost, and eliminating securement of a hole area rate required in a specified area in design.

There has been demanded a new through hole forming method that enables controlling a shape of a through hole to be formed, e.g., enabling formation of a through hole whose diameter remains the same on a laser beam incidence side of a processing target and on a laser beam exit side of the same or enabling formation of a through hole having a so-called inverse tapered shape that a diameter of the formed through hole is larger on a laser beam exit side of the processing target than on a laser beam incidence side of the same.

Here, Japanese Patent Application Laid-open No. 2003-158358 (Patent Document 1) discloses a method of contact-bonding and attaching a protective sheet to a back surface side of a processing target to provide a double structure, irradiating the processing target with a laser beam, forming a hole in the protective sheet partway and then delaminating the protective sheet to obtain a through hole.

Further, Japanese Patent Application Laid-open No. 2004-243404 (Patent Document 2) discloses a technology that vertically irradiates a substrate with a laser beam to form a tapered hole, then irradiates the substrate with a laser beam at a slat and uniforms a hole diameter on an incidence side and that on an exit side to form a straight hole.

Furthermore, Japanese Patent Application Laid-open No. 58051-1999 (Patent Document 3) discloses a technology that sets a focal position of a laser beam above an insulative substrate in a state that a reflecting material (a copper foil) is arranged on a back surface side of the insulative substrate and applies a laser beam, whereby a hole is gradually formed from an upper surface of the substrate and a tapered hole reaching the copper foil is eventually formed. When the irradiation is further continued, the laser beam is reflected on the copper foil to strike on an inner surface of the tapered hole, thereby increasing a diameter of the hole and finally straightening the through hole.

Moreover, Japanese Patent Application Laid-open No. 2001-79677 (Patent Document 4) discloses a technology that bends and laser-processes a synthetic resin elastic sheet at a laser beam irradiating portion to form a hole having a diameter increased on a laser beam exit side and flattens this sheet after the processing, thereby straightening the through hole.

Additionally, Japanese Patent Application Laid-open No. 141766-1996 (Patent Document 5) discloses a technology by which a high-reflectivity plate is arranged below a processing target, a through hole is formed in the processing target by an applied laser beam, and then the incident laser beam is reflected by the high-reflectivity plate, this reflected laser beam strikes on a through hole inner surface or a notch inner surface to effect laser processing, thereby obtaining the through hole or the notch having no tapered shape.

However, according to the technology disclosed in Patent Document 1, hole diameters on the laser beam incidence side and the laser beam exit side are determined based on a thickness of the processing target, and a difference between the hole diameters increases as the thickness rises, whereby forming the through hole having a so-called straight shape becomes difficult. Further, a freedom degree of a shape of the processing target is lowered. Furthermore, attaching the protective sheet to the processing target means that a step of attaching the protective sheet and a step of delaminating the protective sheet after the laser processing are added. Moreover, there are problems of an increase in cost due to the protective sheet and a waste material since the delaminated protective sheet cannot be recycled. Additionally, according to the technology disclosed in Patent Document 1, there is no description or suggestion about a method for forming a through hole having an inverse tapered shape, and forming such a hole is practically impossible by this technology.

Further, according to the technology disclosed in Patent Document 2, the apparatus and its control are complicated and sophisticated since the substrate is vertically irradiated with the laser beam and then the irradiation is performed while inclining and rotating the laser beam emitting unit or the processing target, and hence there occurs a problem that a product cost increases.

The method disclosed in Patent Document 3 has a concern that a processing accuracy is lowered due to a reduction in reflectivity of the reflecting material when the reflecting material is repeatedly used since the reflecting material arranged on the back surface side of the insulative substrate is exposed to the laser beam every time. Furthermore, when applying this method to a thin material in which the processing target is formed of a resin, an effect of the method cannot be expected unless the processing target and the reflecting material are sufficiently in close contact with each other, a freedom degree of a shape of the processing target is lowered, and steps of the contact bonding and the delamination of the reflecting material are added, thus resulting in an increase in cost.

In the method disclosed in Patent Document 4, since the processing target must be bent in accordance with a tapered shape obtained in the laser irradiating portion and a curvature must increase as a thickness of the processing target rises, the processing target may possibly crack or bend at the time of processing, and there is a drawback that this method cannot be practically applied to articles other than those having a tabular shape like a sheet, e.g., cases or various kinds of housings.

In the method disclosed in Patent Document 5, the high-reflectivity plate is arranged below the processing target, but processing using the reflected laser beam may become uneven unless the processing target and the high-reflectivity plate are in close contact with each other. Further, since the reflecting plate is exposed to the laser beam, the processing accuracy may be lowered as the reflectivity is reduced.

As described above, there is not a technology that can be called a through hole forming method which can easily control a shape of a through hole to be formed, e.g., formation of a through hole having a through hole diameter which remains the same on a laser beam incidence side and a laser beam exit side of a processing target irrespective of a shape of the processing target or formation of a through hole having a so-called inverse tapered shape that a diameter of a formed through hole is larger on a laser beam exit side of the processing target than on a laser beam incidence side depending on a use application.

Furthermore, in the conventional technology, as described above, although a minimum value of a distance between axes of through holes (between central axes of through holes) is determined based on a size of an incidence-side diameter of each through hole when adjacently providing the plurality of (many) through holes since a shape of the through holes is smaller on the laser beam exist side than on the laser beam incidence side, the distance between the axes of the through holes cannot be reduced because the incidence-side diameter of each through holes is large. When such a conventional technology is applied to a device in which a size of each through hole must be set to an invisible size, e.g., 100 μm or below in design such as a light transmission unit (a display apparatus and others) or a sound transmission unit (a speaker, a microphone and others) in a mobile phone or a mobile music device, there is a problem that a hole area rate cannot be increased and sufficient light or sound cannot be transmitted.

Patent Document 1: Japanese Patent Application Laid-open No. 2003-158358
Patent Document 2: Japanese Patent Application Laid-open No. 2004-243404
Patent Document 3: Japanese Patent Application Laid-open No. 58051-1999
Patent Document 4: Japanese Patent Application Laid-open No. 2001-79677
Patent Document 5: Japanese Patent Application Laid-open No. 141766-1996

DISCLOSURE OF INVENTION

Problem to be Solved by the Invention

It is an object of the present invention to provide a novel through hole forming method that does not have many problems observed in the above-described conventional laser application through hole forming methods and can easily control a shape of a through hole to be formed, e.g., formation of a through hole having a diameter which remains the same on a laser beam incidence side of a processing target and on a laser beam exit side of the same irrespective of a shape of the processing target or formation of a through hole having a so-called an inverse tapered shape that a diameter of a formed through hole is larger on a laser beam exit side of a processing target than on a laser beam incidence side of the same, which are not obtained by the conventional technologies.

Means for Solving Problem

As a result of proceeding with examination from various aspects to solve the above-described problems, the present inventors have discovered that, when a specific material is brought into contact with an exit plane of a processing target at the time of forming a through hole based on a laser ablation method, a ratio of an incidence-side diameter and an exit-side diameter can be controlled even in not only a case where the processing target is formed of a resin material but also a case where the processing target is formed of a metal material which is considered to be more difficult, thereby bringing the present invention to completion.

That is, to solve the problems described above, a through hole forming method according to the present invention is a through hole forming method based on a laser ablation method that applies a laser beam to a processing target from a laser processor and sublimates a part of the processing target to form a through hole in the processing target, wherein the laser beam is applied in a state where any one or more materials selected from a colloid solution of a high-polymer material, a solution of a high-polymer material and polyol are in contact with a laser beam exit plane of the processing target.

Further, the through hole forming method according to the present invention is characterized in that the laser beam is ultraviolet light.

Furthermore, the through hole forming method according to the present invention is characterized in that the laser beam is any one selected from a third harmonic, a fourth harmonic and a fifth harmonic of a solid laser.

Moreover, the through hole forming method according to the present invention is characterized in that the laser beam is any one selected from a Q switch pulse oscillation YAG laser beam, a Q switch pulse oscillation YLF laser beam and a Q switch pulse oscillation $YVO_4$ laser beam.

Additionally, the through hole forming method according to the present invention is characterized in that the laser beam is an excimer laser beam.

Further, as described above, a through hole formed artifact according to the present invention is a through hole formed artifact characterized in that a through hole is formed by the through hole forming methods above.

Furthermore, according to the through hole formed artifact of the present invention, as described above, in a through hole formed artifact having many through holes each having a diameter of 100 μm or below formed therein, a size of a hole formed portion is larger than a square having each side that is 0.3 mm and a hole area rate of the hole formed portion is 35% or above. Based on this configuration, when applied to a display plane or the like, in spite of the fact that the hole cannot be visually recognized in a light OFF state, very bright display is enabled in a light ON state.

Moreover, according to the through hole formed artifact of the present invention, as described above, in a through hole formed artifact having many through holes each having a diameter of 100μ or below formed therein, a ratio of diameters of each hole in two planes falls within a range between 100:75 and 75:100. Based on this configuration, in spite of the fact that the hole cannot be visually recognized, a very high hole area rate can be achieved.

Effect of the Invention

According to the through hole forming method of the present invention, when a laser beam is applied in a state where an exit surface of the processing target is in contact with a colloid solution of a high-polymer material, a solution of a high-polymer material or polyol, it is easy to control a shape of a through hole to be formed, e.g., formation of a through hole having a diameter which remains the same on a laser beam incidence side and on a laser beam exit side of the processing target or formation of a through hole having a so-called inverse tapered shape that a diameter of the formed through hole is larger on the laser beam exit side of the processing target than on the laser beam incidence side of the same.

At this time, since the above-described contact state can be formed by just adjusting degrees of viscosity of the colloid solution of the high-polymer material and the solution of the high-polymer material to relatively high values or using polyol having relatively high viscosity to be applied to the exit surface of the processing target, the through hole can be formed without being affected by the shape of the processing target, and the processing can be carried out even if a position of the processing target at the time of laser beam application is not only horizontal but also vertical or oblique.

Additionally, it is possible to easily control a shape of a through hole to be formed, e.g., formation of a through hole having a diameter which remains the same on a laser beam incidence side and on a laser beam exit side of the processing target or formation of a through hole having a so-called inverse tapered shape that a diameter of the formed through hole is larger on the laser beam exit side of the processing target than on the laser beam incidence side of the same, through holes can be formed in a very dense state when forming the plurality of through holes in one processing target, and discoloration or deformation does not occur around each through hole, and hence post-processing or finish processing is no longer required.

Further, the colloid solution of the high-polymer material, the solution of the high-polymer material and polyol can be easily removed by just performing wipe or cleaning using a disperse medium or a solvent, a dispersed material, a solute, the disperse medium, the solvent and others can be recycled by combining means such as filtering, condensation or collection in the latter case, thus completely eliminating ejection of a waste material at this time.

According to the through hole forming method, in addition to the above-described configuration, the laser beam emitted from the laser processor is ultraviolet light. Since energy of the ultraviolet light per photon is high, the ultraviolet light can efficiently cut the chemical bond in constituent elements of the processing target, and the laser ablation processing that enables sublimation/removal of the material in a moment can be easily performed. Further, the ultraviolet light causes a photochemical reaction with the colloid solution of the high-polymer material, the solution of the high-polymer material or polyol that is in contact with the processing target back surface (the laser exit surface) because of its high photon energy, and an activated species such as a plasma or a radical can be produced, thus contributing to highly efficient processing of the high-polymer material.

Furthermore, according to the through hole forming method described above, the laser beam is any one selected from the third harmonic, the fourth harmonic and the fifth harmonic of the solid laser. Here, the ultraviolet light having the third harmonic, the fourth harmonic or the fifth harmonic is effective with respect to the processing target formed of a resin that is opaque with respect to the laser beam, and the ultraviolet light having the fourth harmonic or the fifth harmonic is effective with respect to the processing target formed of any resin irrespective of transparency/opacity.

Moreover, according to the through hole forming method described above, the laser beam is any one selected from a YAG laser beam of Q switch pulse oscillation, a YLF laser beam of the Q switch pulse oscillation and a $YVO_4$ laser beam of the Q switch pulse oscillation.

That is, as the laser beam emitted from the laser processor, it is preferable to use each laser beam having a YAG third harmonic (355 nm), a YAG fourth harmonic (266 nm), a YAG fifth harmonic (213 nm), a YLF third harmonic (351 nm), a YLF fourth harmonic (263 nm), a YLF fifth harmonic (211 nm), a $YVO_4$ third harmonic (355 nm), a $YVO_4$ fourth harmonic (266 nm) or a $YVO_4$ fifth harmonic (213 nm) of the Q switch pulse oscillation.

Such lasers enable fine processing, have relatively low apparatus prices and good operability and are easy to be handled as characteristics. In these laser beams, since laser stored energy can be temporarily accumulated and then output at once by using the Q switch pulse oscillation type, an advantage that even a laser apparatus having a low output can obtain a high-peak output can be provided, and through holes each having a tapered shape, a straight shape or an inverse tapered shape can be formed in a very dense state (at a narrow hole pitch).

Further, the invention described above is carried out by using the excimer laser.

Since the excimer laser enables substantially the same processing as that of the ultraviolet light having the third harmonic, the fourth harmonic or the fifth harmonic of the solid laser and also enables higher-output oscillation, through holes can be formed at a plurality of positions in the processing target in block at a narrow hole pitch in a very dense state when a photomask or a multi-lens array is also used.

Furthermore, the through hole formed artifact described above is the through hole formed artifact having the through hole formed by the through hole forming method described above, and it is possible to obtain a desired shape of the through hole to be formed in, e.g., formation of a through hole having a diameter which remains the same on a laser beam incidence side of a processing target and on a laser beam exit side of the same irrespective of a shape of the processing target or formation of a through hole having a so-called an inverse tapered shape that a diameter of a formed through hole is larger on a laser beam exit side of a processing target than on a laser beam incidence side of the same, which cannot be obtained by the conventional technologies.

Moreover, as described above, in a hole formed artifact having many through holes each having a diameter of 100μ or below provided therein, the through hole formed artifact according to the present invention is the through hole formed artifact characterized in that a size of a hole formed portion is larger than a square having each side of 0.3 mm and a hole area rate of the hole formed portion is not less than 35%. Based on this configuration, when applied to, e.g., a display plane, each hole cannot be visually recognized in a non-exhibition, but bright display is enabled in a light ON state.

Moreover, as described above, in a hole formed artifact having many through holes each having a diameter of 100 μm or below provide therein, the through hole formed artifact according to the present invention is the through hole formed artifact characterized in that the ratio of diameters of each hole in two planes falls within a range between 100:75 and 75:100 and, at this time, the pitch between holes can be further reduced, whereby the hole area rate can be improved to, e.g., 50% or above. As a result, the very high hole area rate can be achieved even though each hole cannot be visually recognized.

BRIEF DESCRIPTION OF DRAWINGS

FIG. 9 is microscope photographs of an aluminum plate subjected to laser processing (Example 8);

FIG. 10 is microscope photographs of a stainless plate subjected to laser processing (Example 9);

FIG. 13 is a view showing a result in Example 10;
FIG. 14 is a view showing a result in Example 10;
FIG. 15 is a view showing a result in Example 10;
FIG. 17 is a view showing a result in Example 11;
FIG. 20 is a view showing a result in Example 14;
FIG. 23 is a view showing a result in Example 17.

| EXPLANATIONS OF LETTERS OR NUMERALS | |
|---|---|
| 1a | resonant mirror (total reflecting mirror) |
| 1b | resonant mirror (partial reflecting mirror) |
| 2 | Q switch |
| 3 | nonlinear optical device |
| 4 | controller |
| 5 | laser beam scanner (galvano scanning mirror) |
| 6 | condense lens |
| 7 | lens protective cover |
| 8 | processing target |
| 9 | fixed stage |
| 10 | ultraviolet laser beam |
| 11 | incidence plane |
| 12 | exit plane |
| 13 | colloid solution of high-polymer material |
| 14 | solution of high-polymer material |
| 15 | polyol |
| LP | laser processor |
| LS | ultraviolet laser beam source |
| LM | solid laser medium |

BEST MODE(S) FOR CARRYING OUT THE INVENTION

The present invention can be carried out by using, e.g., a laser processor LP shown in a schematic block diagram of FIG. 1 as follows.

Figure 1:
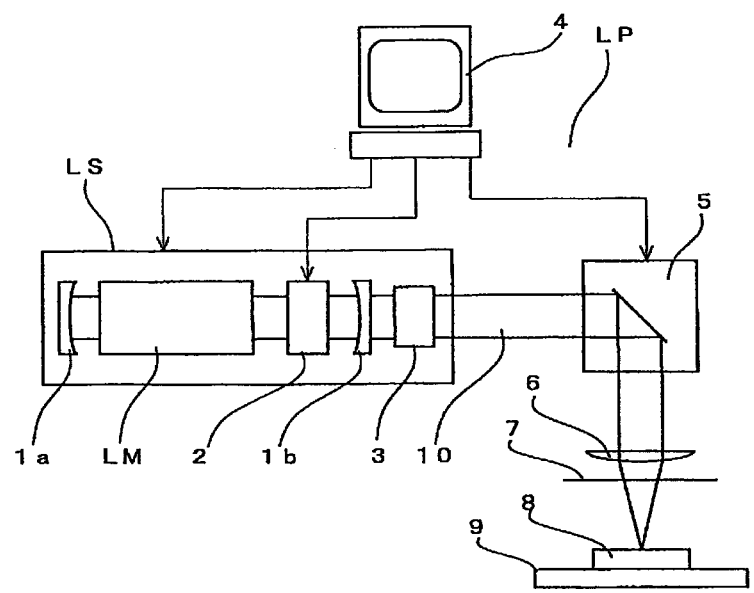
FIG. 1 is a schematic block diagram showing an example of a laser processor used in the present invention.

As shown in FIG. 1, the laser processor LP is an apparatus that processes a processing target 8, and it includes an ultraviolet laser beam source (a laser oscillator) LS, a laser beam scanner (a galvano scanning mirror) 5 configured to scan the processing target 8 with a laser beam 10 in a set laser irradiation range, a controller 4 configured to control a Q switch 2 and the laser beam scanner 5, a condenser lens 6 configured to condense the laser beam 10, a lens protective cover 7 configured to avoid laser beam reflection to the condenser lens 6 and protect a lens surface, and a fixed stage 9 on which the processing target 8 is mounted. Further, an excimer laser may be used as the ultraviolet laser beam source LS.

The ultraviolet laser beam source LS is constituted of a resonant mirror 1a formed of a solid laser medium LM and a total reflecting mirror, a resonant mirror 1b formed of a partial reflecting mirror, a Q switch 2 and a nonlinear optical device 3 that converts a fundamental wave oscillated from the solid laser medium LM into a third harmonic or a fourth harmonic. The solid medium laser LM is arranged on the resonant mirror 1a side and the Q switch 2 is arranged on the resonant mirror 1b side between the resonant mirrors 1a and 1b so that the resonant mirrors 1a and 1b and the solid laser medium LM can perform optical resonance.

Further, irradiation energy may be controlled by controlling a timing of the Q switch 2 since stored energy can be emitted at a burst to obtain a laser beam having high-peak power by continuing the optical resonance between the resonant mirror 1a, the solid laser medium LM, the Q switch 2 and the resonant mirror 1b and operating the Q switch 2, or it may be changed by controlling a current value supplied to an excitation laser diode (not shown) constituting the ultraviolet laser beam source LS or a lamp.

Figure 2:
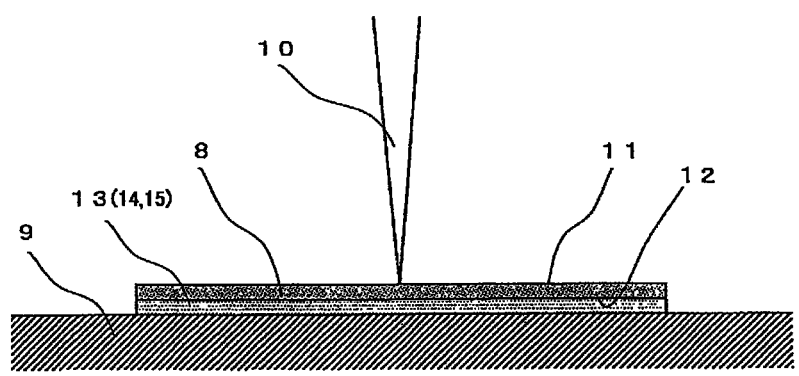
FIG. 2 is an explanatory view showing a state near a processing target at the time of forming a through hole.

FIG. 2 is an explanatory view showing a state near the processing target (a sheet-like material formed of a resin in this example, which is specifically a case material of a mobile phone) 8 mounted on the fixed stage 9.

As a material of the processing target 8, there is, e.g., a polymer resin material such as polyethylene terephthalate (a PET resin), an acrylic resin, polycarbonate (PC) or polyimide (PI), various kinds of reinforce plastic, a resin laminated material containing a metal layer such as a metallic decorative sheet, or a metallic material such as aluminum, iron (stainless), titanium, magnesium or an alloy of these material.

Furthermore, a colloid solution 13 of a high-polymer material, a solution 14 of a high-polymer material or polyol 15 is arranged so as to come into contact with a back surface (an exit plane 12) of a laser beam incidence plane 11 of the processing target 8.

Specifically, the processing target may be held in such a manner that the back surface of the laser beam incidence plane 11 of the processing target comes into contact with a liquid level of the colloid solution 13 of the high-polymer material, the solution 14 of the high-polymer material or polyol 15 put in a container, and the through hole forming method according to the present invention can be carried out even if irregularities are formed on the back surface of the incidence plane 11 in this case, but such a liquid may be applied to the back surface of the laser beam incidence plane 11 of the processing target, and a freedom degree of a shape of the processing target on the back surface side of the incidence plane 11 is further increased in this case.

In case of the contact achieved by the application, the colloid solution 13 of the high-polymer material, the solution 14 of the high-polymer material or polyol 15 may be applied to the exit plane 12 side of the processing target 8 by using means such as a roller, a brush or spraying or may be applied by using general means such as bringing the exit plane 12 side of the processing target 8 into contact with the liquid level of the stored colloid solution 13 of the high-polymer material, the solution 14 of the high-polymer material or polyol 15. At this time, when an application thickness is 10 μm or above, a diameter increasing effect can be stably obtained, which is preferable. It is to be noted that the effect remains the same even if the application thickness is increased to some extent, e.g., greater than 2000 μm, and hence setting this thickness in a range that facilitates formation of an application layer, e.g., a range from 50 μm to 2000 μm is preferable. Here, in case of an application agent having a low degree of viscosity, there is a tendency that a good result can be obtained when the application layer is increased in thickness.

As the colloid solution of the high-polymer material, there are, e.g., a starch solution (e.g., a commercially available starch glue), polyvinyl acetate emulsion, a natural rubber-based latex, an acrylic latex, a polyurethane-based latex, a synthetic rubber-based latex and others, one type of these materials may be used or a plurality of types may be mixed and used as long as the effect of the present invention is not jeopardized.

Concentrations of dispersed materials of these colloid solutions are previously examined in accordance with each type, and examination is previously appropriately carried out to determine each concentration so that an intended hole shape can be obtained based on, e.g., a processing target thickness or a target through hole diameter.

Here, when a gel having no flowability is used in place of the colloid solution, the effect of the present invention cannot be obtained. That is, since the gel has no freedom in shape, a freedom degree of shape of the exit plane 12 of the processing target 8 is lowered, and the effect of the present invention cannot be obtained. That is, it is considered that the gel cannot surround an exit hole since it has no flowability as compared with the colloid solution (a sol), and a through hole shape adjustment function cannot be obtained since energy cannot be concentrated on the vicinity of each hole due to an influence of evacuation of a plasma.

As the solution of the high-polymer material, there are aqueous solutions of a polyvinyl alcohol (PVA), a polymer of acrylic acid, polyacrylamide (PAM), a polyethylene oxide (PEO), carboxymethylcellulose sodium (CMC, CM cellulose) and methylcellulose (MC), and organic solvent solutions of cellulose nitrate and the like. Concentrations of materials of these solutions are previously examined and determined for each type so as to form a target shape of the through hole in accordance with each thickness of work objects or a target through hole diameter.

As the aqueous solution of the high-polymer material, an aqueous solution using polyvinyl alcohol (PVA) as a solute and water as a solvent is particularly preferable since it is an inexpensive biodegradable polymer, which has biodegradability and biocompatibility and does not impose a load on an environment at the time of disposal processing.

Moreover, when such an aqueous solution 13 of the high-polymer material containing polyvinyl alcohol (PVA) is applied to the processing target 8, since the polyvinyl alcohol (PVA) has properties that it is readily dissolved in warm water, the aqueous solution 13 of the high-polymer material can be easily removed from the processing target 8 by cleaning the processing target 8 with warm water after laser processing. Additionally, when this cleaning water is filtered, recycle can be effected by adjusting moisture so that the polyvinyl alcohol (PVA) can have an adequate concentration after removing laser ablation scattered particles, thus eliminating almost all waste materials.

In the present invention, polyol, i.e., multivalent alcohol (an aliphatic compound having two or more hydroxyl groups —OH) can be used besides the colloid solution of the high-polymer material and the solution of the high-polymer material. As polyol, a fluid substance having two or more hydroxyl groups may be used. As such a material, there are ethylene glycol, glycerin, diglycerol, polyglycerol (a general expression (1) of polyglycerol is shown below. A material having a repeating unit n in the expression which is 10 on average can be readily obtained) and others, and these material may be used as they are or they may be mixed with water to be used. Alternatively, polyol that is usually a solid but turns to a liquid when water is added can be used, and there is an aqueous solution of polyvinyl alcohol (PVA) as an example of such polyol.

[Chemical Formula I]

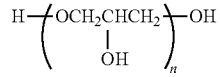

In the through hole forming method according to the present invention, when an opaque article is determined as a processing target, it is possible to use a laser beam obtained by converting fundamental oscillation wavelength light of an ultraviolet laser, e.g., an $F_2$ (a wavelength: 157 nm), ArF (a wavelength: 193 nm), KrCl (a wavelength: 222 nm), KrF (a wavelength: 248 nm), XeCl (a wavelength: 308 nm) or XeF (a wavelength: 351 nm) excimer laser or a fundamental oscillation wavelength light of a YAG laser, YLF laser, a $YVO_4$ laser or a dye laser into a third harmonic, a fourth harmonic or a fifth harmonic by using a nonlinear optical device and others.

However, when a transparent article is determined as the processing target, for example, a fundamental oscillation wavelength (a wavelength: 1064 nm), the second harmonic wave (a wavelength: 532 nm) or the third harmonic (a wavelength: 355 nm) of, e.g., the YAG laser passes through the transparent processing target, and hence processing cannot be performed. To avoid such an inconvenience and effect processing with respect to the processing target irrespective of transparency/opacity, a laser beam having the fourth harmonic (a wavelength: 266 nm) or the fifth harmonic (a wavelength: 213 nm) is preferable. In case of the excimer laser, $F_2$ (the wavelength: 157 nm), ArF (the wavelength: 193 nm), KrCl (the wavelength: 222 nm) or KrF (the wavelength: 248 nm) is preferable.

A laser intensity/a pulse width/the number of times of irradiation required for processing are adjusted in many ways and determined in accordance with a material or a thickness of the processing target 8, a single-layer configuration or a multilayer configuration containing different kinds of resins, a configuration such as presence/absence of processing, e.g., hard coating or an intended through hole shape.

EXAMPLES

Although the present invention will now be descried based on the examples, an explanation of each example does not restrict the present invention.

Example 1

A commercially available aqueous synthetic glue which is a solution of a high-polymer material containing polyvinyl alcohol (PVA) as a main component was used as a solution of a high-polymer material, and the laser processor LP (a Q switched Nd:YAG laser manufactured by Continuum:) shown in FIG. 1 was utilized to perform through hole forming processing under the following processing conditions.

Processing target: a transparent PET resin sheet having a thickness of 48 μm (a light cured acrylic hard coat layer having a thickness of 10 μm is laminated on an incidence plane side)

Application material: a commercially available aqueous synthetic glue obtained by dissolving polyvinyl alcohol in water (components: polyvinyl alcohol 13%, water 86.5% and others 0.5%. Arabic Yamato glue manufactured by Yamato)

Applying conditions: application was effected and then a glass plate was utilized for pressing. At this time, a thickness is approximately 100 μm (this can be likewise applied to the following examples)

Applying position: a laser beam exit plane side
Laser beam: a YAG fourth harmonic (a wavelength: 266 nm, a focal length: f=50 mm)
Focal position: a surface of the transparent PET resin sheet on an incidence plane side
Energy: 10 μJ
Pulse width: 4 to 6 ns
Number of times of irradiation: 105 times/hole
Hole pitch: 24 μm
Temperature: an ordinary temperature
Pressure: an ordinary pressure
Assist gas: none

Comparative Examples 1a and 1b

To compare with an effect of Example 1, through hole forming processing was performed under two conditions, i.e., a situation where drying was performed after application (Comparative Example 1a) and a situation where application was not performed (Comparative Example 1b) and also under the same conditions as those of Example 1 in regard to other points.

Applying Condition 1: the aqueous synthetic glue adopted in Example 1 was applied to have a thickness of 100 μm and then this glue was dried at a room temperature (no flowability).

Applying condition 2: nothing was applied.

Figure 3:
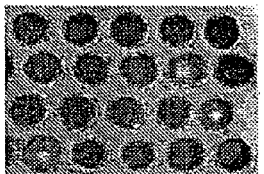
FIG. 3 is microscope photographs of a transparent PET sheet (Example 1) subjected to through hole forming processing using a laser.
Figure 3:
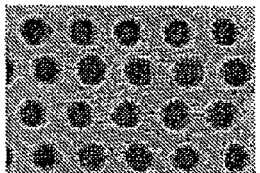
Figure 3:
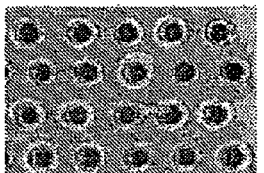
Figure 3:
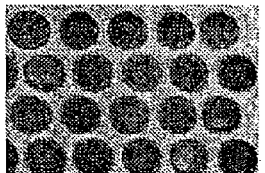
Figure 3:
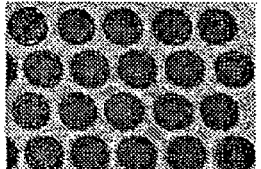
Figure 3:
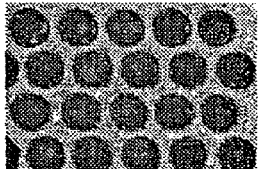

FIG. 3 and Table 1 show results of Example 1 ("PVA aqueous solution application") and Comparative Examples 1a ("drying after application") and 1b ("no application"). A hole diameter of each through hole formed on the exit plane side and the incidence plane side of the sheet was measured by using an optical microscope, and a measured value and a ratio obtained by dividing an exit diameter by an incidence diameter (an average value in any case) are written. A through hole having a straight shape in which an exit hole diameter is equal to an incidence hole diameter was formed when this ratio (which is called an "exit/incidence ratio") is 1.0, a through hole having a tapered shape in which the hole diameter is narrowed toward the exit plane was formed when this ratio is smaller than 1.0, and a through hole having an inverse tapered shape in which the hole diameter increases toward the exit plane was formed when this ratio is larger than 1.0.

TABLE 1

|  | PVA AQUEOUS SOLUTION APPLICATION | | DRYING AFTER APPLICATION | | NO APPLICATION | |
| --- | --- | --- | --- | --- | --- | --- |
|  | AVERAGE HOLE DIAMETER | EXIT/ INCIDENCE | AVERAGE HOLE DIAMETER | EXIT/ INCIDENCE | AVERAGE HOLE DIAMETER | EXIT/ INCIDENCE |
| EXIT PLANE | 17.77 μm | 0.86 | 14.60 μm | 0.70 | 13.84 μm | 0.67 |
| INCIDENCE PLANE | 20.67 μm |  | 20.79 μm |  | 20.73 μm |  |

In FIG. 3 and Table 1, the example where the commercially available aqueous synthetic glue as the aqueous solution of the high-polymer material containing polyvinyl alcohol (PVA) as a main component is applied, the example where the same is applied and then dried and the example where the same is not applied had substantially the same hole diameter levels on the laser beam incidence plane side. On the other hand, an average hole diameter on the exit plane side in the example where the commercially available aqueous synthetic glue as the aqueous solution of the high-polymer material containing polyvinyl alcohol (PVA) as a main component is applied was increased by approximately 3.9 μm as compared with that in the example where the same is not applied, the hole diameter in the sheet obtained by applying and drying the aqueous synthetic glue was increased by just approximately 0.8 μm from the hole diameter in the sheet obtained without application of the aqueous synthetic glue, and hence it was confirmed that the hole diameter adjustment effect cannot be fully obtained and it is insufficient when the aqueous solution of the high-polymer material is applied and then dried in Comparative Example 1a.

Furthermore, when the commercially available aqueous synthetic glue as the aqueous solution of the high-polymer material containing polyvinyl alcohol (PVA) as a main component was applied and the through hole forming processing using the laser was effected, the exit/incidence ratio is close to 1.0 as compared with the other conditions, and it can be understood that a through hole having a substantially straight shape which is slightly pinched on the exit plane side was formed in Example 1.

It is to be noted that, since the processing is carried out under the laser ablation conditions in any case as depicted in FIG. 3, a periphery of each through hole is rarely thermally affected, thereby forming the through holes at a narrowed hole pitch in a very dense state. Here, giving a detailed description on the hole shape formed on the exit plane side, although an ejected deposit involved by the laser processing is observed around each through hole in the sheet (Comparative Example 1b) subjected to the through hole forming processing using the laser without the application of the aqueous synthetic glue which is the aqueous solution of the high-polymer material, such a deposit is not observed in the transparent PET resin sheet (Example 1) subjected to the through hole forming processing using the laser with the application of the synthetic glue as the aqueous solution of the high-polymer material, and it can be understood that the neat through hole forming processing can be carried out. When the neat through hole forming processing is possible in this manner, subsequent finish processing is not required at all.

1 was utilized to perform through hole forming processing using a laser under the following processing conditions.

Processing target: a transparent PET resin sheet having a thickness of 60 μm (a light cured acrylic hard coat layer having a thickness of 10 μm is laminated on an incidence plane side)

Application material: a woodworking glue manufactured by Konish which is a commercially available sol type water dispersible woodworking adhesive which contains polyvinyl acetate as a main component (components: polyvinyl acetate 41% and water 59%)

Applying conditions: a thickness is approximately 100 μm

Applying position: a laser beam exit plane side

Laser beam: a YAG fourth harmonic (a wavelength: 266 nm, a focal length: f=50 mm)

Focal position: a surface of the transparent PET resin sheet on an incidence plane side Energy: 5 μJ Pulse width: 4 to 6 ns Number of times of irradiation: 150 times/hole, 300 times/hole, 900 times/hole, 1800 times/hole Hole pitch: 30 μm Temperature: an ordinary temperature Pressure: an ordinary pressure Assist gas: none Further, as Comparative Example 2-1, the through hole forming processing using the laser was carried out under the same conditions as those in Example 2-1 except that the water dispersible woodworking adhesive is not applied. Table 2 shows results of these examples.

TABLE 2

| | | TIMES OF IRRADIATION | | | | | | | |
|---|---|---|---|---|---|---|---|---|---|
| | | 150 TIMES/HOLE | | 300 TIMES/HOLE | | 900 TIMES/HOLE | | 1800 TIMES/HOLE | |
| | | AVERAGE HOLE DIAMETER | EXIT/ INCIDENCE | AVERAGE HOLE DIAMETER | EXIT/ INCIDENCE | AVERAGE HOLE DIAMETER | EXIT/ INCIDENCE | AVERAGE HOLE DIAMETER | EXIT/ INCIDENCE |
| EXAMPLE 2-1 | EXIT PLANE | 15.87 μm | 0.84 | 22.15 μm | 1.15 | 25.19 μm | 1.31 | 23.20 μm | 1.05 |
| | INCIDENCE PLANE | 18.95 μm | | 19.20 μm | | 19.28 μm | | 22.02 μm | |
| COMPARATIVE EXAMPLE 2-1 | EXIT PLANE | 7.77 μm | 0.42 | 8.80 μm | 0.45 | 9.91 μm | 0.47 | 10.74 μm | 0.50 |
| | INCIDENCE PLANE | 18.53 μm | | 19.52 μm | | 21.00 μm | | 21.56 μm | |

Figure 4:
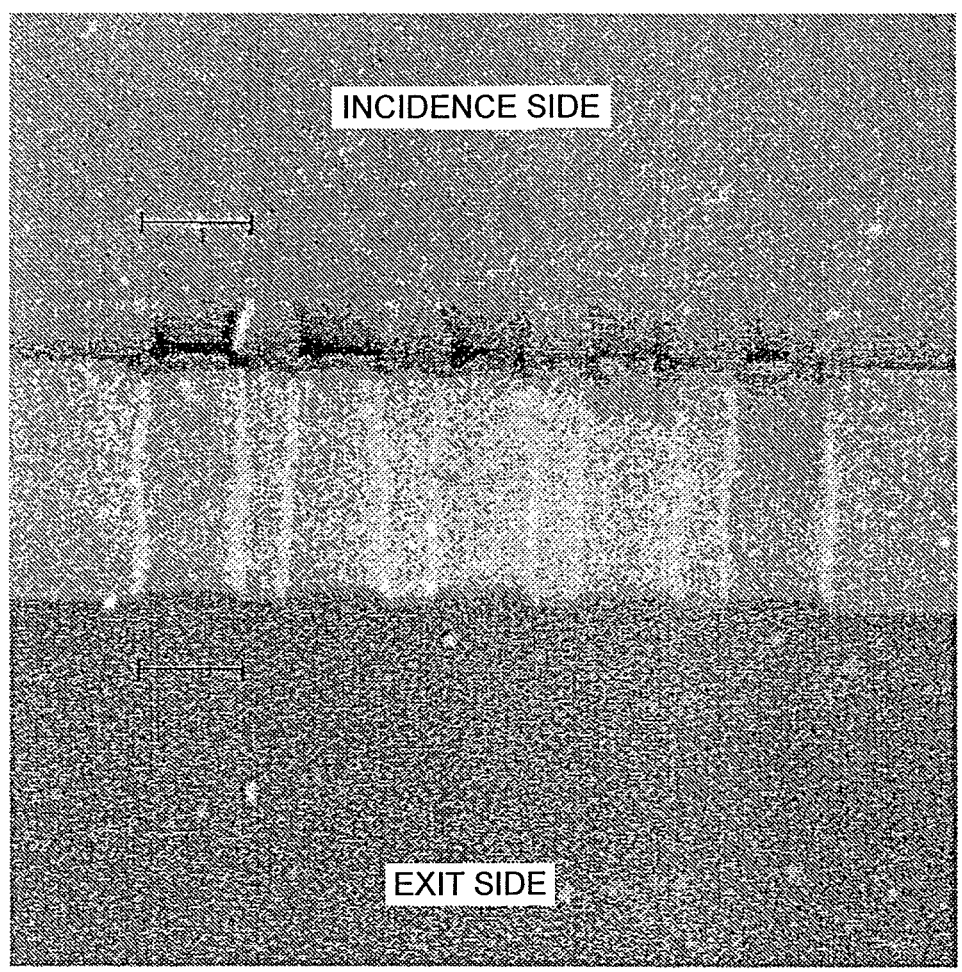
FIG. 4 is a microscope photograph of a cross section including through holes in the sheet depicted in FIG. 3.

Here, FIG. 4 shows a microscope photograph of a cut surface when the transparent PET resin sheet having the through holes formed with the PVA aqueous solution being applied to the exit side is cut so as to include its through holes.

It can be understood from FIG. 4 that each formed through hole has a cylindrical shape that an inner diameter at a central portion is equal to a hole diameter in the incidence plane and a hole diameter in the exit plane and a hole wall is continuously formed between a light cured acrylic hard coat layer having a thickness of 10 μm on the incidence side and a PET layer having a thickness of 48 μm on the exit side.

Example 2-1

Then, a commercially available sol type water dispersible woodworking adhesive which contains polyvinyl acetate as a main component was utilized as a colloid solution of a high-polymer material, and the laser processor LP depicted in FIG.

Example 2-2

A transparent PET resin sheet that is thicker than that in Example 2-1 was utilized as a through hole formation processing target to carry out through hole forming processing using a laser. Processing conditions are as follows.

Processing target: a transparent PET resin sheet having a thickness of 120 μm (a light cured acrylic hard coat layer having a thickness of 20 μm is laminated on an incidence plane side)

Application material: a commercially available water dispersible woodworking adhesive, which is the same as that used in Example 2-1

Applying conditions: a thickness is approximately 100 μm

Applying position: a laser beam exit plane side

Laser beam: a YAG fourth harmonic (a wavelength: 266 nm, a focal length: f=50 mm)

Focal position: a surface of the transparent PET resin sheet on an incidence plane side Energy: 5 μJ
Pulse width: 4 to 6 ns
Number of times of irradiation: 300 times/hole, 900 times/hole, 1800 times/hole
Hole pitch: 30 μm
Temperature: an ordinary temperature
Pressure: an ordinary pressure
Assist gas: none Furthermore, as Comparative Example 2-2, the through hole forming processing using the laser was carried out under the same conditions as those in Example 2-2 except that the water dispersible woodworking adhesive is not applied. Table 3 shows results of these examples.

Application material: a commercially available water dispersible woodworking adhesive, which is the same as that used in Example 2-1
Applying conditions: a thickness is approximately 100 μm
Applying position: a laser beam exit plane side
Laser beam: a YAG fourth harmonic (a wavelength: 266 nm, a focal length: f=50 mm)
Focal position: a surface of the metallic decorative sheet on an incidence plane side
Energy: 20 μJ
Pulse width: 4 to 6 ns
Number of times of irradiation: 300 times/hole, 900 times/hole

TABLE 3

| | | TIMES OF IRRADIATION | | | | | |
|---|---|---|---|---|---|---|---|
| | | 300 TIMES/HOLE | | 900 TIMES/HOLE | | 1800 TIMES/HOLE | |
| | | AVERAGE HOLE DIAMETER | EXIT/INCIDENCE | AVERAGE HOLE DIAMETER | EXIT/INCIDENCE | AVERAGE HOLE DIAMETER | EXIT/INCIDENCE |
| EXAMPLE 2-2 | EXIT PLANE | 14.67 μm | 0.78 | 19.05 μm | 0.99 | 19.39 μm | 1.05 |
| | INCIDENCE PLANE | 18.88 μm | | 19.25 μm | | 19.15 μm | |
| COMPARATIVE EXAMPLE 2-2 | EXIT PLANE | 7.95 μm | 0.43 | 7.95 μm | 0.40 | 8.67 μm | 0.43 |
| | INCIDENCE PLANE | 18.68 μm | | 19.94 μm | | 20.18 μm | |

Example 2-3

In this example, a metallic decorative sheet was utilized as a processing target to perform laser processing. Processing conditions are as follows.

Processing target: a metallic decorative sheet (a thickness is 205 μm. A sheet obtained by sequentially laminating a polyester film having a thickness of 50 μm, a chromium metal layer having a thickness of 40 nm, an urethane-based adhesive layer having a thickness of 5 μm and an olefin-based thermoplastic elastomer (TPO) film having a thickness of 150 μm in the mentioned order). An exit plane is provided on the polyester film side.

Hole pitch: 50 μm

Temperature: an ordinary temperature

Pressure: an ordinary pressure

Assist gas: none

Moreover, as Comparative Example 2-3, the through hole forming processing using the laser was carried out under the same conditions as those in Example 2-3 except that the water dispersible woodworking adhesive is not applied. Table 4 shows results of these examples.

TABLE 4

| | | TIMES OF IRRADIATION | | | |
|---|---|---|---|---|---|
| | | 300 TIMES/HOLE | | 900 TIMES/HOLE | |
| | | AVERAGE HOLE DIAMETER | EXIT/ INCIDENCE | AVERAGE HOLE DIAMETER | EXIT/ INCIDENCE |
| EXAMPLE 2-3 | EXIT PLANE | 33.34 μm | 1.79 | 35.22 μm | 1.83 |
| | INCIDENCE PLANE | 18.58 μm | | 19.26 μm | |
| COMPAR- ATIVE EXAMPLE 2-3 | EXIT PLANE | 10.04 μm | 0.51 | 10.64 μm | 0.57 |
| | INCIDENCE PLANE | 19.55 μm | | 18.65 μm | |

It can be understood from the results shown in Table 2 to Table 4 that, when the commercially available woodworking adhesive containing polyvinyl acetate as a main component is applied to the laser beam exit plane side of the processing target, each hole diameter is obviously increased as compared with the counterpart obtained by the laser processing without the application of the adhesive, and the through holes having the straight shape to the inverse tapered shape are formed.

Here, in Example 2-1 described above, FIG. 5 shows a microscope photograph of a cut surface when the transparent PET resin sheet having the through holes formed based on the irradiation carried out 900 times/hole is cut so as to include its through holes.

Figure 5:
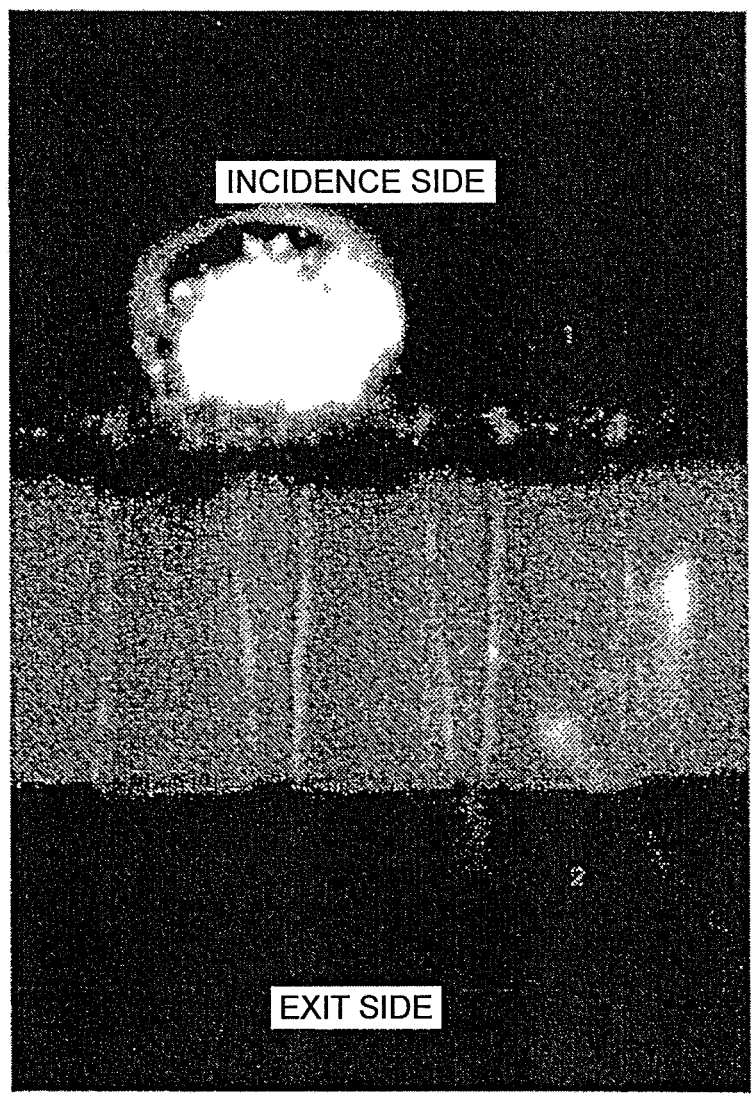
FIG. 5 is a microscope photograph of a cross section of the sheet subjected to through hole forming processing in Example 2-1.

It can be understood from FIG. 5 that each formed through hole has a circular truncated conical shape that a hole diameter in the exit plane is slightly larger than a hole diameter in the incidence plane and a hole wall is continuously formed between a light cured acrylic hard coat layer having a thickness of 10 μm on the incidence side and a PET layer having a thickness of 60 μm on the exit side (it is to be noted that a white portion which can be seen on the incidence plane side at the central portion is an air bubble imaged at the time of taking the microscope photograph).

Example 3-1

A commercially available solution-based adhesive which contains nitrocellulose as a main component was used as an organic solvent solution of a high-polymer material, and the laser processor LP depicted in FIG. 1 was utilized to carry out the through hole forming processing using a laser under the following processing conditions. It is to be noted that the organic solvent which is apt to volatilize was used as the solution-based adhesive, and hence finishing the through hole forming processing using the laser within 10 minutes after application of the adhesive was tried for the purpose of obtaining a stable result.

Processing target: a transparent PET resin sheet having a thickness of 60 μm (a light cured acrylic hard coat layer having a thickness of 10 μm is laminated on an incidence plane side).

Application material: a solution-based adhesive which contains nitrocellulose as a main component and consists of a commercially available solution of a high-polymer material (components: nitrocellulose 25%, an organic solvent 75%. Cemedine manufactured by Cemedine Co., Ltd.)

Applying conditions: a thickness is approximately 100 μm

Applying position: a laser beam exit plane side

Laser beam: a YAG fourth harmonic (a wavelength: 266 nm, a focal length: f=50 mm)

Focal position: a surface of the transparent PET resin sheet on an incidence plane side Energy: 5 μJ Pulse width: 4 to 6 ns Number of times of irradiation: 150 times/hole, 300 times/hole, 900 times/hole, 1800 times/hole Hole pitch: 30 μm Temperature: an ordinary temperature Pressure: an ordinary pressure Assist gas: none Additionally, as Comparative Example 3-1, the through hole forming processing using the laser was carried out under the same conditions as those in Example 3-1 except that the solution-based adhesive is not applied. Table 5 shows results of these examples.

TABLE 5

| | | TIMES OF IRRADIATION | | | | | | | |
|---|---|---|---|---|---|---|---|---|---|
| | | 150 TIMES/HOLE | | 300 TIMES/HOLE | | 900 TIMES/HOLE | | 1800 TIMES/HOLE | |
| | | AVERAGE HOLE DIAMETER | EXIT/ INCIDENCE | AVERAGE HOLE DIAMETER | EXIT/ INCIDENCE | AVERAGE HOLE DIAMETER | EXIT/ INCIDENCE | AVERAGE HOLE DIAMETER | EXIT/ INCIDENCE |
| EXAMPLE 3-1 | EXIT PLANE | 12.08 μm | 0.65 | 16.37 μm | 0.83 | 22.12 μm | 1.08 | 23.76 μm | 1.14 |
| | INCIDENCE PLANE | 18.61 μm | | 19.69 μm | | 20.43 μm | | 20.88 μm | |
| COMPAR- ATIVE EXAMPLE 3-1 | EXIT PLANE | 7.77 μm | 0.42 | 8.80 μm | 0.45 | 9.91 μm | 0.47 | 10.74 μm | 0.50 |
| | INCIDENCE PLANE | 18.53 μm | | 19.52 μm | | 21.00 μm | | 21.56 μm | |

Example 3-2

A transparent PET resin sheet that is thicker than that in Example 3-1 was utilized as a processing target to carry out through hole forming processing using a laser. Processing conditions are as follows.

Processing target: a transparent PET resin sheet having a thickness of 120 μm (a light cured acrylic hard coat layer having a thickness of 20 μm is laminated on an incidence plane side)

Application material: a commercially available solution-based adhesive that contains nitrocellulose as a main component (which is the same as that used in Example 3-1)

Applying conditions: a thickness is approximately 100 μm
Applying position: a laser beam exit plane side
Laser beam: a YAG fourth harmonic (a wavelength: 266 nm, a focal length: f=50 mm)
Focal position: a surface of the transparent PET resin sheet on an incidence plane side
Energy: 5 μJ
Pulse width: 4 to 6 ns
Number of times of irradiation: 300 times/hole, 900 times/hole, 1800 times/hole
Hole pitch: 30 μm
Temperature: an ordinary temperature
Pressure: an ordinary pressure
Assist gas: none Furthermore, as Comparative Example 3-2, the through hole forming processing using the laser was carried out under the same conditions as those in Example 3-2 except that the solution-based adhesive is not applied. Table 6 shows results of these examples.

polyester film having a thickness of 50 μm, a chromium metal layer having a thickness of 40 nm, an urethane-based adhesive layer having a thickness of 5 μm and an olefin-based thermoplastic elastomer (TPO) film having a thickness of 150 μm in the mentioned order). An exit plane is provided on the polyester film side.

Application material: a commercially available solution-based adhesive that contains nitrocellulose as a main component (which is the same as that used in Example 3-2)

Applying conditions: a thickness is approximately 100 μm
Applying position: a laser beam exit plane side
Laser beam: a YAG fourth harmonic (a wavelength: 266 nm, a focal length: f=50 mm)
Focal position: a surface of the metallic decorative sheet on an incidence plane side
Energy: 20 μJ
Pulse width: 4 to 6 ns
Number of times of irradiation: 300 times/hole, 900 times/hole
Hole pitch: 50 μm
Temperature: an ordinary temperature
Pressure: an ordinary pressure

TABLE 6

| | | TIMES OF IRRADIATION | | | | | |
|---|---|---|---|---|---|---|---|
| | | 300 TIMES/HOLE | | 900 TIMES/HOLE | | 1800 TIMES/HOLE | |
| | | AVERAGE HOLE DIAMETER | EXIT/ INCIDENCE | AVERAGE HOLE DIAMETER | EXIT/ INCIDENCE | AVERAGE HOLE DIAMETER | EXIT/ INCIDENCE |
| EXAMPLE 3-2 | EXIT PLANE | 15.53 μm | 0.84 | 19.31 μm | 1.05 | 21.63 μm | 1.13 |
| | INCIDENCE PLANE | 18.52 μm | | 18.45 μm | | 19.10 μm | |
| COMPARATIVE EXAMPLE 3-2 | EXIT PLANE | 7.95 μm | 0.43 | 7.95 μm | 0.40 | 8.67 μm | 0.43 |
| | INCIDENCE PLANE | 18.68 μm | | 19.94 μm | | 20.18 μm | |

Example 3-3

Then, through hole forming processing using a laser was carried out with respect to a metallic decorative sheet as a processing target. Processing conditions are as follows.

Processing target: a metallic decorative sheet (a thickness is 205 μm. A sheet obtained by sequentially laminating a Assist gas: none Additionally, as Comparative Example 3-3, the through hole forming processing using the laser was carried out under the same conditions as those in Example 3-3 except that the solution-based adhesive is not applied. Table 7 shows results of these examples.

TABLE 7

| | | TIMES OF IRRADIATION | | | |
| --- | --- | --- | --- | --- | --- |
| | | 300 TIMES/HOLE | | 900 TIMES/HOLE | |
| | | AVERAGE HOLE DIAMETER | EXIT/ INCIDENCE | AVERAGE HOLE DIAMETER | EXIT/ INCIDENCE |
| EXAMPLE 3-3 | EXIT PLANE | 27.02 μm | 1.24 | 33.24 μm | 1.43 |
| | INCIDENCE PLANE | 21.73 μm | | 23.32 μm | |
| COMPAR- ATIVE | EXIT PLANE | 10.04 μm | 0.51 | 10.64 μm | 0.57 |
| EXAMPLE 3-3 | INCIDENCE PLANE | 19.55 μm | | 18.65 μm | |

It can be understood from Table 5 to Table 7 that, when the commercially available solution-based adhesive that mainly contains nitrocellulose as an organic solvent solution of a high-polymer material is applied to the laser beam exit plane side of the processing target to carry out the through hole forming processing using the laser, each through hole having a hole diameter obviously increased on the exit plane side was formed as compared with the counterpart obtained by the laser processing without the application of the adhesive.

Comparative Example 4-1

To confirm a difference in diameter increasing effect that arises due to a difference between qualities of materials that come into contact with an exit plane, through hole forming processing using a laser was performed with respect to a transparent PET resin sheet under the following conditions.

Processing target: a transparent PET resin sheet having a thickness of 60 μm (a light cured acrylic hard coat layer having a thickness of 10 μm is laminated on an incidence plane side)

Materials brought into contact with the exit plane: water type gels [konjac (a commercially available food) (Comparative Example 4-1a), gelatin (a commercially available food jelly) (Comparative Example 4-1b), agar (a commercially available food) (Comparative Example 4-1c), a commercially available refrigerant (a water type gel in which a sodium polyacrylate is a dispersed material) (Comparative Example 4-1d)], tap water in Nagaoka city (Comparative Example 4-1e), a synthetic detergent (Charmy manufactured by Lion Corporation) (Comparative Example 4-1f)

Contact conditions: in regard to gels, a piece sliced to have a thickness of approximately 1000 μm was brought into contact. A liquid application thickness is approximately 100 μm.

Contact position: a laser beam exit plane side

Laser beam: a YAG fourth harmonic (a wavelength: 266 nm, a focal length: f=50 mm)

Focal position: a surface of the transparent PET resin sheet on an incidence plane side Energy: 5 μJ Pulse width: 4 to 6 ns Number of times of irradiation: 150 times/hole, 300 times/hole, 900 times/hole, 1800 times/hole Hole pitch: 30 μm Temperature: an ordinary temperature Pressure: an ordinary pressure Assist gas: none Further, as a comprehensive evaluation, an evaluation was conducted while representing a situation where hole diameters on the exit side are uneven and impractical as "Δ" and a situation where breakage or a crack is produced to disable practical realization as "x". Table 8 shows results of these examples.

TABLE 8

| | | TIMES OF IRRADIATION | | | | | | | | |
| --- | --- | --- | --- | --- | --- | --- | --- | --- | --- | --- |
| | | 150 TIMES/HOLE | | 300 TIMES/HOLE | | 900 TIMES/HOLE | | 1800 TIMES/HOLE | | |
| | | AVERAGE HOLE DIAMETER | EXIT/ INCI- DENCE | AVERAGE HOLE DIAMETER | EXIT/ INCI- DENCE | AVERAGE HOLE DIAMETER | EXIT/ INCI- DENCE | AVERAGE HOLE DIAMETER | EXIT/ INCI- DENCE | COMPRE- HENSIVE EVALUATION |
| COMPAR- ATIVE EXAMPLE 4-1a | EXIT PLANE INCIDENCE PLANE | 13.72 μm 18.72 μm | 0.73 | 17.81 μm 19.86 μm | 0.90 | 25.43 μm — | — | — — | — | x BREAKAGE |
| COMPAR- ATIVE EXAMPLE 4-1b | EXIT PLANE INCIDENCE PLANE | 12.68 μm 19.05 μm | 0.67 | 17.57 μm 19.69 μm | 0.89 | 22.73 μm 20.79 μm | 1.09 | 24.24 μm 22.72 μm | 1.07 | Δ EXIT HOLE DIAMETER UNEVENNESS |
| COMPAR- ATIVE EXAMPLE 4-1c | EXIT PLANE INCIDENCE PLANE | 12.34 μm 18.03 μm | 0.68 | 16.52 μm 20.00 μm | 0.83 | 14.41 μm 20.70 μm | 0.70 | 12.64 μm — | — | Δ EXIT HOLE DIAMETER UNEVENNESS |
| COMPAR- ATIVE EXAMPLE 4-1d | EXIT PLANE INCIDENCE PLANE | 14.63 μm 18.49 μm | 0.79 | 20.44 μm 18.52 μm | 1.10 | 18.48 μm — | — | 17.87 μm 20.35 μm | 0.88 | x BREAKAGE HOLE DIAMETER UNEVENNESS |

TABLE 8-continued

| | | TIMES OF IRRADIATION | | | | | | | |
|---|---|---|---|---|---|---|---|---|---|
| | | 150 TIMES/HOLE | | 300 TIMES/HOLE | | 900 TIMES/HOLE | | 1800 TIMES/HOLE | |
| | | AVERAGE HOLE DIAMETER | EXIT/INCI-DENCE | AVERAGE HOLE DIAMETER | EXIT/INCI-DENCE | AVERAGE HOLE DIAMETER | EXIT/INCI-DENCE | AVERAGE HOLE DIAMETER | EXIT/INCI-DENCE | COMPRE-HENSIVE EVALUATION |
| COMPAR-ATIVE EXAMPLE 4-1e | EXIT PLANE | 11.06 μm | 0.60 | 13.78 μm | — | — | — | — | — | x BREAKAGE |
| | INCIDENCE PLANE | 18.55 μm | | — | | — | | — | | |
| COMPAR-ATIVE EXAMPLE 4-1f | EXIT PLANE | 13.21 μm | 0.69 | 16.42 μm | 0.85 | 19.72 μm | 0.98 | 17.40 μm | 0.81 | Δ EXIT HOLE DIAMETER UNEVENNESS |
| | INCIDENCE PLANE | 19.15 μm | | 19.40 μm | | 20.15 μm | | 21.40 μm | | |

Comparative Example 4-2

A transparent PET resin sheet thicker than that in Comparative Example 4-1 was utilized as a processing target to perform laser processing. Processing conditions are as follows.

Processing target: a transparent PET resin sheet having a thickness of 120 μm (a light cured acrylic hard coat layer having a thickness of 20 μm is laminated on an incidence plane side)

Materials brought into contact with the exit plane: the same as those used in Comparative Example 4-1. However, water type gels [konjac (Comparative Example 4-2a), gelatin (Comparative Example 4-2b), agar (Comparative Example 4-2c), a commercially available refrigerant (Comparative Example 4-2d)], tap water in Nagaoka city (which will be also referred to as "tap water" hereinafter) (Comparative Example 4-2e), a synthetic detergent (Charmy manufactured by Lion Corporation) (Comparative Example 4-2f) were examined.

Contact conditions: in regard to gels, a piece sliced to have a thickness of approximately 1000 μm was brought into contact. A liquid application thickness is approximately 100 μm.

Contact position: a laser beam exit plane side

Laser beam: a YAG fourth harmonic (a wavelength: 266 nm, a focal length: f=50 mm)

Focal position: a surface of the transparent PET resin sheet on an incidence plane side Energy: 5 μJ Pulse width: 4 to 6 ns Number of times of irradiation: 300 times/hole, 900 times/hole, 1800 times/hole Hole pitch: 30 μm Temperature: an ordinary temperature Pressure: an ordinary pressure Assist gas: none Table 9 shows a result.

TABLE 9

| | | TIMES OF IRRADIATION | | | | | | |
|---|---|---|---|---|---|---|---|---|
| | | 300 TIMES/HOLE | | 900 TIMES/HOLE | | 1800 TIMES/HOLE | | |
| | | AVERAGE HOLE DIAMETER | EXIT/INCIDENCE | AVERAGE HOLE DIAMETER | EXIT/INCIDENCE | AVERAGE HOLE DIAMETER | EXIT/INCIDENCE | COMPRE-HENSIVE EVALUATION |
| COMPAR-ATIVE EXAMPLE 4-2a | EXIT PLANE | 13.52 μm | 0.76 | 23.16 μm | 1.24 | — | — | x BREAKAGE, HOLE DIAMETER UNEVENNESS |
| | INCIDENCE PLANE | 17.85 μm | | 18.65 μm | | 19.36 μm | | |
| COMPAR-ATIVE EXAMPLE 4-2b | EXIT PLANE | 13.72 μm | 0.72 | 19.37 μm | 0.98 | 19.99 μm | 0.93 | Δ EXIT HOLE DIAMETER UNEVENNESS |
| | INCIDENCE PLANE | 18.94 μm | | 19.80 μm | | 21.53 μm | | |
| COMPAR-ATIVE EXAMPLE 4-2c | EXIT PLANE | 14.76 μm | 0.83 | 15.12 μm | 0.80 | 10.98 μm | 0.53 | Δ EXIT HOLE DIAMETER UNEVENNESS |
| | INCIDENCE PLANE | 17.68 μm | | 18.84 μm | | 20.78 μm | | |
| COMPAR-ATIVE EXAMPLE 4-2d | EXIT PLANE | 11.33 μm | 0.57 | 12.56 μm | 0.60 | 12.23 μm | 0.57 | Δ EXIT HOLE DIAMETER UNEVENNESS |
| | INCIDENCE PLANE | 19.71 μm | | 20.86 μm | | 21.64 μm | | |
| COMPAR-ATIVE EXAMPLE 4-2e | EXIT PLANE | 10.17 μm | 0.53 | 10.74 μm | 0.53 | 9.52 μm | 0.43 | x DIAMETER INCREASING EFFECT NOT OBTAINED |
| | INCIDENCE PLANE | 19.04 μm | | 20.32 μm | | 22.00 μm | | |
| COMPAR-ATIVE EXAMPLE 4-2f | EXIT PLANE | 11.18 μm | 0.57 | 19.37 μm | 0.95 | 18.19 μm | 0.89 | x CRACK ON INCIDENCE PLANE |
| | INCIDENCE PLANE | 19.78 μm | | 20.37 μm | | 20.54 μm | | |

Comparative Example 4-3

The following materials were utilized, and a metallic decorative sheet was adopted as a comparative example processing target to perform laser processing. Processing conditions are as follows.

Processing target: a metallic decorative sheet (a thickness is 205 μm. A sheet obtained by sequentially laminating a polyester film having a thickness of 50 μm, a chromium metal layer having a thickness of 40 nm, an urethane-based adhesive layer having a thickness of 5 μm and an olefin-based thermoplastic elastomer (TPO) film having a thickness of 150 μm in the mentioned order). An exit plane is provided on the polyester film side.

Materials brought into contact with the exit plane: the same as those used in Comparative Example 4-1. However, water type gels [konjac (Comparative Example 4-3a), gelatin (Comparative Example 4-3b), agar (Comparative Example 4-3c), a commercially available refrigerant (Comparative Example 4-3d)], glycerin (a test example (Example) 4-3e)

Contact conditions: in regard to gels, a piece sliced to have a thickness of approximately 1000 μm was brought into contact. A liquid application thickness is approximately 100 μm.

Contact position: a laser beam exit plane side

Laser beam: a YAG fourth harmonic (a wavelength: 266 nm, a focal length: f=50 mm)

Focal position: a surface of the metallic decorative sheet on an incidence plane side Energy: 20 μJ Pulse width: 4 to 6 ns Number of times of irradiation: 300 times/hole, 900 times/hole Hole pitch: 50 μm Temperature: an ordinary temperature Pressure: an ordinary pressure Assist gas: none Table 10 shows results obtained here. It is to be noted that a term "transformation around exit hole" in the table means a state where a dark shadow can be seen around a formed hole in observation using transmitted illumination.

It can be understood from Table 8 to Table 10 that, when the water type gel [konjac, gelatin, agar or a refrigerant (sodium polyacrylate)] was in contact with the exit plane, a crack or breakage occurred on the exit plane to connect the holes adjacent to each other, a phenomenon that exit hole diameters become uneven occurred, or discoloration occurred around the exit hole, and hence it cannot be said the through hole processing is appropriate even though a diameter increasing effect can be observed.

Further, when tap water was used, breakage occurred on the exit plane to connect the holes adjacent to each other, the diameter increasing effect was rarely observed, or a phenomenon that exit hole diameters are uneven occurred, which is not preferred. It is to be noted that glycerin was decided to be again examined since the exit hole diameters became partially uneven (as a result, the unevenness in exit hole diameters was not restaged, and it can be understood that an excellent result can be repeatedly obtained).

When the synthetic detergent was used, it was revealed that a phenomenon that exit hole diameters become uneven occurred in the transparent PET sheet having a thickness of 60 μm, a crack was produced in the incidence plane of the transparent PET sheet having a thickness of 120 μm, and both the sheets cannot be put into practical use.

Example 5

Moreover, to confirm a relationship between laser energy and a hole shape that differs depending on the number of times of irradiation, through hole forming processing using a laser was carried out under the following conditions.

Processing target: a metallic decorative sheet (a thickness is 205 μm. A sheet obtained by sequentially laminating a polyester film having a thickness of 50 μm, a chromium metal layer having a thickness of 40 nm, an urethane-based adhesive layer having a thickness of 5 μm and an olefin-based thermoplastic elastomer (TPO) film having a thickness of 150 μm in the mentioned order). An exit plane is provided on the polyester film side.

TABLE 10

| | | TIMES OF IRRADIATION | | | | |
|---|---|---|---|---|---|---|
| | | 300 TIMES/HOLE | | 900 TIMES/HOLE | | |
| | | AVERAGE HOLE DIAMETER | EXIT/ INCIDENCE | AVERAGE HOLE DIAMETER | EXIT/ INCIDENCE | COMPREHENSIVE EVALUATION |
| COMPARATIVE EXAMPLE 4-3a | EXIT PLANE | 15.49 μm | 0.75 | 24.85 μm | 1.29 | Δ EXIT HOLE PERIPHERY TRANSFORMATION |
| | INCIDENCE PLANE | 20.54 μm | | 19.23 μm | | |
| COMPARATIVE EXAMPLE 4-3b | EXIT PLANE | 23.51 μm | 1.31 | 26.11 μm | 1.44 | Δ EXIT HOLE PERIPHERY TRANSFORMATION |
| | INCIDENCE PLANE | 17.88 μm | | 18.18 μm | | |
| COMPARATIVE EXAMPLE 4-3c | EXIT PLANE | 23.76 μm | 1.42 | 25.67 μm | 1.39 | Δ EXIT HOLE PERIPHERY TRANSFORMATION |
| | INCIDENCE PLANE | 16.70 μm | | 18.49 μm | | |
| COMPARATIVE EXAMPLE 4-3d | EXIT PLANE | 23.73 μm | 1.24 | 30.62 μm | 1.51 | Δ EXIT HOLE PERIPHERY TRANSFORMATION |
| | INCIDENCE PLANE | 19.08 μm | | 20.26 μm | | |
| EXAMPLE 4-3e | EXIT PLANE | 23.16 μm | 1.33 | 22.89 μm | 1.29 | ○ EXCELLENT |
| | INCIDENCE PLANE | 17.35 μm | | 17.76 μm | | |

Application material: an aqueous synthetic glue obtained by dissolving polyvinyl alcohol in water (which is the same as that used in Example 1)

Applying conditions: an application thickness is approximately 100 μm

Applying position: a laser beam exit plane side

Laser beam: a YAG fourth harmonic (a wavelength: 266 nm, a focal length: f=50 mm)

Focal position: a surface of the metallic decorative sheet on an incidence plane side Energy: 7 μJ, 10 μJ, 12 μJ, 15 μJ, 18 μJ and 20 μJ Pulse width: 4 to 6 ns Number of times of irradiation per hole: 150 times, 210 times, 300 times, 360 times, 450 times, 600 times, 750 times, 1050 times, 1200 times, 1500 times Hole pitch: 50 μm Temperature: an ordinary temperature Pressure: an ordinary pressure Assist gas: none An average hole diameter on the incidence plane side and an average hole diameter on the exit plane side of the metallic decorative sheet after the laser processing were measured, respectively.

Moreover, a metallic decorative sheet having no synthetic glue applied thereto was subjected to laser processing under the same conditions at energy of 20 μJ and the above-described numbers of times of irradiation per hole, and an average hole diameter on an incidence plane side and an average hole diameter on an exit plane side were measured, respectively. Table 11 and Table 12 show results. Additionally, Table 13 collectively show relationships between these numbers of times of irradiation and hole shapes (ratios each of which is obtained by dividing an exit hole diameter by an incidence hole diameter).

TABLE 11

(AVERAGE HOLE DIAMETER ON EXIT PLANE SIDE)

| ENERGY | SYNTHETIC GLUE | TIMES OF IRRADIATION | | | | | | | | | |
|---|---|---|---|---|---|---|---|---|---|---|---|
| | | 150 | 210 | 300 | 360 | 450 | 600 | 750 | 1050 | 1200 | 1500 |
| 7 μJ | APPLIED | HOLE UNFORMED | HOLE UNFORMED | HOLE UNFORMED | HOLE UNFORMED | HOLE UNFORMED | 5.28 | 6.14 | 9.38 | 8.21 | 10.43 |
| 10 μJ | APPLIED | 8.77 | 13.42 | 15.13 | 16.10 | 16.94 | 19.48 | 17.94 | 22.87 | 23.62 | 25.22 |
| 12 μJ | APPLIED | 12.72 | 15.70 | 18.59 | 18.44 | 21.36 | 20.97 | 20.58 | 21.17 | 20.79 | 21.40 |
| 15 μJ | APPLIED | 15.18 | 20.52 | 24.25 | 25.61 | 26.32 | 25.22 | 26.95 | 28.40 | 27.84 | 27.40 |
| 18 μJ | APPLIED | 19.24 | 23.59 | 26.56 | 28.95 | 30.76 | 28.09 | 30.72 | 33.10 | 35.08 | 35.85 |
| 20 μJ | APPLIED | 18.04 | 26.69 | 29.00 | 30.30 | 31.56 | 31.77 | 33.18 | 34.51 | 37.10 | 37.41 |
| 20 μJ | NOT APPLIED | 12.39 | 13.13 | 12.73 | 11.59 | 13.05 | 12.89 | 12.46 | 12.97 | 14.69 | 13.92 |

(UNIT: μm)

TABLE 12

(AVERAGE HOLE DIAMETER ON INCIDENCE PLANE SIDE)

| ENERGY | SYNTHETIC GLUE | TIMES OF IRRADIATION | | | | | | | | | |
|---|---|---|---|---|---|---|---|---|---|---|---|
| | | 150 | 210 | 300 | 360 | 450 | 600 | 750 | 1050 | 1200 | 1500 |
| 7 μJ | APPLIED | 16.29 | 13.07 | 13.83 | 15.51 | 14.72 | 17.55 | 15.40 | 15.92 | 18.11 | 16.75 |
| 10 μJ | APPLIED | 15.36 | 16.71 | 19.23 | 17.59 | 18.14 | 15.47 | 18.47 | 19.65 | 18.00 | 18.23 |
| 12 μJ | APPLIED | 19.10 | 18.59 | 19.05 | 18.47 | 19.96 | 17.83 | 19.46 | 18.43 | 18.28 | 19.15 |
| 15 μJ | APPLIED | 21.00 | 22.84 | 21.61 | 22.17 | 20.60 | 19.48 | 18.52 | 18.49 | 21.59 | 22.80 |
| 18 μJ | APPLIED | 22.87 | 22.42 | 22.22 | 21.27 | 21.96 | 21.08 | 21.29 | 19.57 | 18.09 | 27.42 |
| 20 μJ | APPLIED | 22.89 | 21.56 | 19.83 | 22.78 | 20.89 | 21.14 | 21.73 | 20.65 | 19.28 | 19.87 |
| 20 μJ | NOT APPLIED | 20.80 | 20.86 | 21.09 | 19.69 | 22.85 | 21.84 | 20.42 | 20.18 | 22.25 | 21.37 |

(UNIT: μm)

TABLE 13

RELATIONSHIP BETWEEN TIMES OF IRRADIATION AND HOLE SHAPE (RATIO OBTAINED BY DIVIDING EXIT HOLE DIAMETER BY INCIDENCE HOLE DIAMETER)

| ENERGY | SYNTHETIC GLUE | TIMES OF IRRADIATION | | | | | | | | | |
|---|---|---|---|---|---|---|---|---|---|---|---|
| | | 150 | 210 | 300 | 360 | 450 | 600 | 750 | 1050 | 1200 | 1500 |
| 7 μJ | APPLIED | — | — | — | — | — | 0.3 | 0.4 | 0.6 | 0.5 | 0.6 |
| 10 μJ | APPLIED | 0.6 | 0.8 | 0.8 | 0.9 | 0.9 | 1.3 | 1.0 | 1.2 | 1.3 | 1.4 |
| 12 μJ | APPLIED | 0.7 | 0.8 | 1.0 | 1.0 | 1.1 | 1.2 | 1.1 | 1.1 | 1.1 | 1.1 |
| 15 μJ | APPLIED | 0.7 | 0.9 | 1.1 | 1.2 | 1.3 | 1.3 | 1.5 | 1.5 | 1.3 | 1.2 |
| 18 μJ | APPLIED | 0.8 | 1.1 | 1.2 | 1.4 | 1.4 | 1.3 | 1.4 | 1.7 | 1.9 | 1.3 |
| 20 μJ | APPLIED | 0.8 | 1.2 | 1.5 | 1.3 | 1.5 | 1.5 | 1.5 | 1.7 | 1.9 | 1.9 |
| 20 μJ | NOT APPLIED | 0.6 | 0.6 | 0.6 | 0.6 | 0.6 | 0.6 | 0.6 | 0.6 | 0.7 | 0.7 |

The following matters can be understood from Table 11 and Table 12. That is, comparing the example where the laser beam is applied from the metallic decorative sheet back surface and the synthetic glue as an aqueous solution of a high-polymer material is applied to the surface (the exit plane) with the example where the synthetic glue is not applied, each incidence hole diameter increases in accordance with a laser energy amount irrespective of the number of times of irradiation. On the other hand, in regard to each exit hole diameter, the hole diameter increases with each laser energy amount when the number of times of irradiation rises in the example where the synthetic glue is applied, whereas the hole diameter rarely changes even though the number of times of irradiation rises in the example where the synthetic glue is not applied.

Further, comparing the laser energy amounts required for processing the same through hole in terms of the exit hole diameters, the example where the synthetic glue as the aqueous solution of the high-polymer material is applied to the exit plane enables the processing with a laser energy amount which is approximately a half of that of the example where the synthetic glue is not applied, and hence energy saving can be realized, resulting in a reduction in processing cost.

Figure 6:
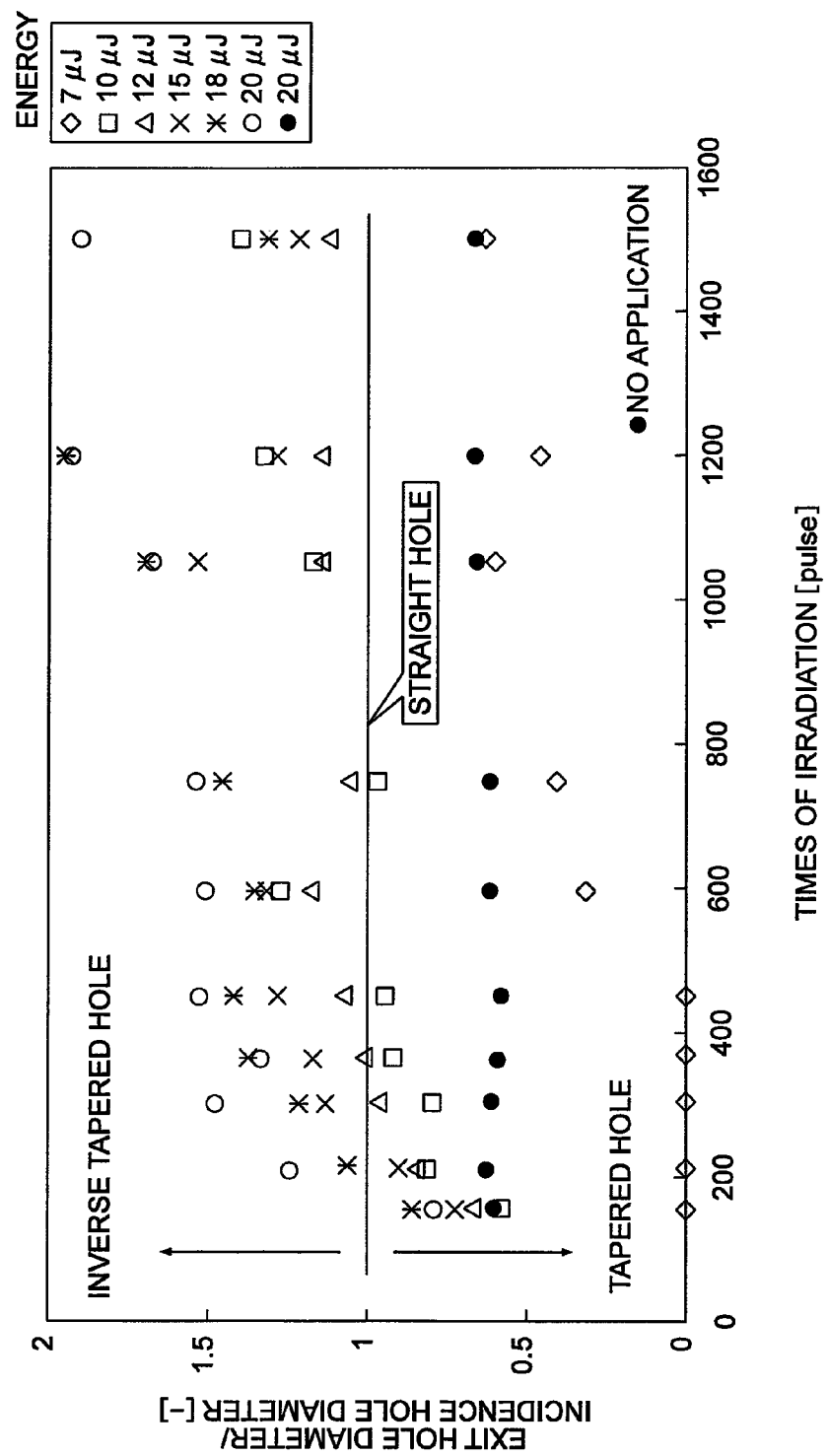
FIG. 6 is a graph showing a relationship between the number of times of irradiation and a hole shape (a ratio of an exist hole diameter/an incidence hole diameter) (Example 5)

Furthermore, Table 13 shows each relationship between the number of times of irradiation and the hole shape in terms of the ratio obtained by dividing the exit hole diameter by the incidence hole diameter, and FIG. 6 shows a graph of this Table 13. This drawing shows that a through hole having a straight shape in which an exit hole diameter is equal to an incidence hole diameter is formed when an ordinate "exit hole diameter/incidence hole diameter" is 1.0, a through hole having a tapered shape that is pinched toward the exit plane is formed when the same is smaller than 1.0, and a through hole having an inverse tapered shape that expands toward the exit plane is formed when the same is larger than 1.0. Based on Table 13 and FIG. 6, in case of applying a laser beam from the metallic decorative sheet back surface to perform the through hole forming processing, when the synthetic glue as the aqueous solution of the high-polymer material is applied to the surface of the sheet (the exit plane) to change the conditions (the numbers of times of irradiation), each desired through hole having the tapered shape, the straight shape or the inverse tapered shape can be formed, namely, a hole shape can be adjusted.

Example 6

The same metallic decorative sheet as that described above was subjected to through hole forming processing using an ultraviolet laser of a YAG third harmonic (a wavelength: 355 nm). Processing conditions are as follows.

Figure 7:
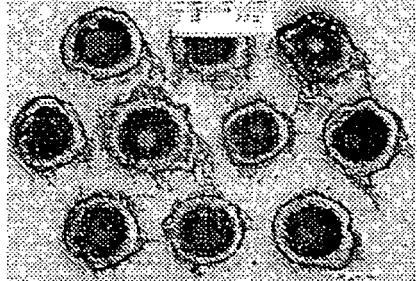
FIG. 7 is microscope photographs of a metallic decorative sheet subjected to laser processing using a third harmonic (Example 6)
Figure 7:
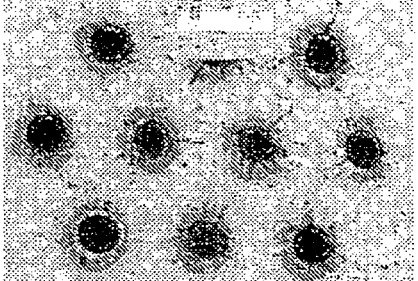
Figure 7:
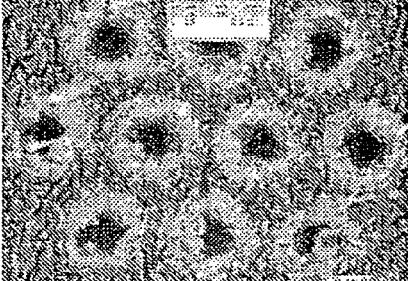
Figure 7:
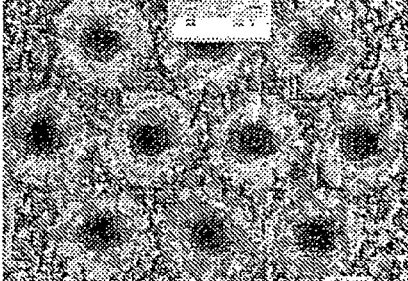

Processing target: a metallic decorative sheet, which is the same as that used in Example 2-3
Application material: a synthetic glue containing polyvinyl alcohol as a main component (which is the same as that used in Example 1)
Applying conditions: an application thickness is approximately 100 μm
Applying position: a laser beam exit plane side
Laser beam: a YAG third harmonic (a wavelength: 355 nm, a focal length: f=50 mm)
Focal position: a surface of the metallic decorative sheet on an incidence plane side
Energy: 80 μJ
Pulse width: 4 to 6 ns
Number of times of irradiation: 100 times/hole
Hole pitch: 80 μm
Temperature: an ordinary temperature
Pressure: an ordinary pressure
Assist gas: none Further, a metallic decorative sheet having no synthetic glue applied thereto was processed under the same conditions. FIG. 7 shows results of these examples in the form of microscope photographs of the exit plane side and the incidence plane side of each metallic decorative sheet. Since the metallic decorative sheet is opaque with respect to the third harmonic, processing can be carried out based on an ablation phenomenon without transmission of light.

As shown in FIG. 7, a hole diameter of each through hole on the incidence plane side was 29.6 μm in the metallic decorative sheet whilst the same was 29.1 μm in the metallic decorative sheet having no synthetic glue applied thereto, and hence both the bore diameters were substantially the same. On the other hand, a hole diameter of each through hole on the exit plane side was increased to substantially the same level as the incidence hole diameter, i.e., 29.4 μm in the metallic decorative sheet having the synthetic glue applied thereto, whereas the hole diameter was 16.9 in the metallic decorative sheet having no synthetic glue applied thereto and hence an increase in hole diameter was not observed. In regard to a ratio obtained by dividing the exit hole diameter by the incidence hole diameter, it was 0.99 in the metallic decorative sheet having the synthetic glue applied thereto, whereas it was 0.58 in the metallic decorative sheet having no synthetic glue applied thereto. As can be understood from this result of Example 6, when the synthetic glue mainly containing polyvinyl alcohol (PVA) which is the aqueous solution of the high-polymer material is applied with the thickness of 100 μm to the exit plane side of the metallic decorative sheet and the laser processing is effected with the third harmonic, the hole diameter of each formed through hole on the exit plane side can be increased, and each desired through hole having the tapered shape, the straight shape or the inverse tapered shape can be formed like the examples where the fourth harmonic is utilized to effect the laser processing.

Example 7

A transparent polycarbonate (PC) sheet was subjected to through hole forming processing using a laser. Processing conditions were as follows.

Figure 8:
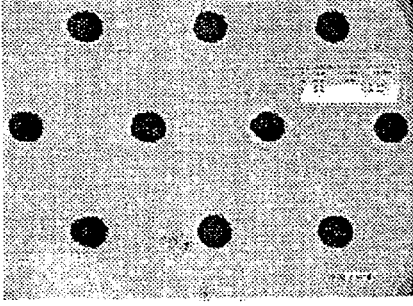
FIG. 8 is microscope photographs of a transparent polycarbonate sheet subjected to laser processing (Example 7)
Figure 8:
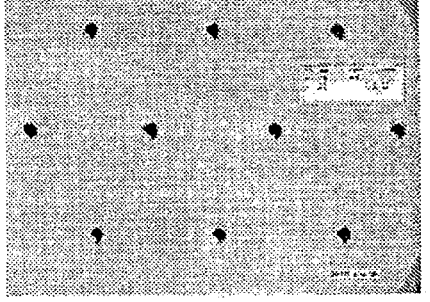
Figure 8:
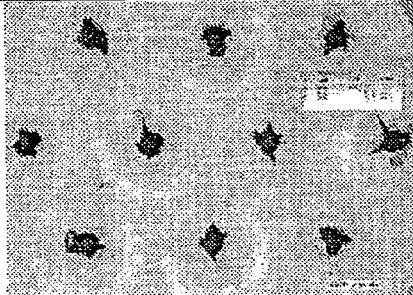
Figure 8:
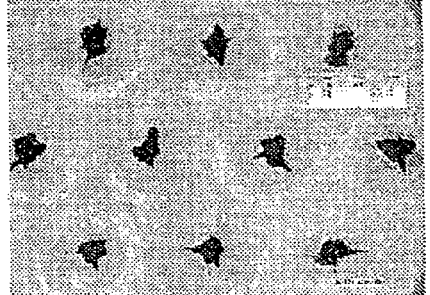

Processing target: a transparent polycarbonate sheet having a thickness of 1000 μm
Application material: an aqueous synthetic glue obtained by dissolving polyvinyl alcohol in water (which is the same as that used in Example 1)
Applying conditions: an application thickness is approximately 100 μm
Applying position: a laser beam exit plane side
Laser beam: a YAG fourth harmonic (a wavelength: 266 nm, a focal length: f=50 mm)
Focal position: a surface of the transparent polycarbonate sheet on an incidence plane side
Energy: 50 μJ
Pulse width: 4 to 6 ns
Number of times of irradiation: 1800 times/hole
Hole pitch: 200 μm
Temperature: an ordinary temperature
Pressure: an ordinary pressure
Assist gas: none Furthermore, a transparent polycarbonate (PC) sheet having no synthetic resin applied thereto was processed under the same conditions. FIG. 8 shows results of these examples in the form of microscope photographs of the exit plane side and the incidence plane side of each transparent polycarbonate (PC) sheet.

As shown in FIG. 8, a hole diameter of each through hole on the incidence plane side was 47.96 μm in the transparent polycarbonate (PC) sheet having the synthetic glue as the aqueous solution of the high-polymer material applied thereto whilst the same was 45.39 μm in the transparent polycarbonate (PC) sheet having no synthetic glue applied thereto, and hence both the hole diameters were substantially equal. On the other hand, a hole diameter of each through hole on the exit plane side was increased beyond the incidence hole diameter, i.e., 55.99 μm in the transparent polycarbonate (PC) sheet having the synthetic glue applied thereto, whereas the hole diameter was 21.19 μm in the transparent polycarbonate (PC) sheet having no synthetic glue applied thereto and hence an increase in hole diameter was not observed. In regard to a ratio obtained by dividing the exit hole diameter by the incidence hole diameter, it was 1.17 in the transparent polycarbonate (PC) sheet having the synthetic glue applied thereto, whereas it was 0.47 in the transparent polycarbonate (PC) sheet having no synthetic glue applied thereto, and hence the diameter increasing effect obtained by applying the synthetic glue was obvious. As described above, even when the synthetic glue mainly containing polyvinyl alcohol (PVA) which is the aqueous solution of the high-polymer material is applied with the thickness of 100 μm to the exit plane side of the transparent polycarbonate (PC) sheet and the laser processing is effected with the fourth harmonic, the hole diameter of each formed through hole on the exit plane side can be increased like the examples where the PET sheet is subjected to the laser processing.

Example 8

An aluminum plate was subjected to through hole forming processing using a laser. Processing conditions are as follows.
Processing target: an aluminum plate having a thickness of 160 μm
Application material: no application (which is represented as "air (open)": Comparative Example), an aqueous synthetic glue obtained by dissolving polyvinyl alcohol in water (which is used in Example 1: represented as "PVA": Example), a commercially available sol type water dispersible woodworking adhesive containing polyvinyl acetate as a main component (which is used in Example 2-1: represented as "vinyl acetate": Example), an aqueous solution obtained by dissolving carboxymethylcellulose sodium (2 g) in water (50 mL) (which is represented as "cellulose": Example)
Applying conditions: a thickness is approximately 100 μm
Applying position: a laser beam exit plane side
Laser beam: a YAG third harmonic (a wavelength: 355 nm, a focal length: f=100 mm)
Focal position: a surface of the aluminum plate on an incidence plane side
Energy: 320 μJ
Pulse width: 4 to 6 ns
Number of times of irradiation: 100 times/hole
Hole pitch: 100 μm
Temperature: an ordinary temperature
Pressure: an ordinary pressure
Assist gas: none
FIG. 9 shows results of the examples in the form of microscope photographs of the exit plane side and the incidence plane side of each aluminum, and this drawing also shows incidence diameters (average diameters) and exit diameters (average diameters) measured from these photographs and calculation results of the exit diameter/incidence diameter, respectively.

As can be understood from FIG. 9, even in case of the processing with respect to the aluminum plates, an exit diameter increasing effect was conformed in the above-described "PVA", "vinyl acetate" and "cellulose" according to the present invention, but the exit diameter increasing effect was not obtained in "air (open)" which is Comparative Example.

Comparative Example 9

A stainless plate was subjected to through hole forming processing using a laser. Processing conditions are as follows.
Processing target: a stainless plate (SUS304) having a thickness of 190 μm
Application material: no application (which is represented as "air (open)": Comparative Example), an aqueous synthetic glue obtained by dissolving polyvinyl alcohol in water (which is used in Example 1: represented as "PVA": Example), a commercially available sol type water dispersible woodworking adhesive containing polyvinyl acetate as a main component (which is used in Example 2-1: represented as "vinyl acetate": Example), an aqueous solution obtained by dissolving carboxymethylcellulose sodium (2 g) in water (50 mL) (which is represented as "cellulose": Example)
Applying conditions: a thickness is approximately 100 μm
Applying position: a laser beam exit plane side
Laser beam: a YAG third harmonic (a wavelength: 355 nm, a focal length: f=100 mm)
Focal position: a surface of the stainless plate on an incidence plane side
Energy: 320 μJ
Pulse width: 4 to 6 ns
Number of times of irradiation: 400 times/hole
Hole pitch: 100 μm
Temperature: an ordinary temperature
Pressure: an ordinary pressure
Assist gas: none
FIG. 10 shows results of the examples in the form of microscope photographs of the exit plane side and the incidence plane side of each aluminum, and this drawing also shows incidence diameters (average diameters) and exit diameters (average diameters) measured from these photographs and calculation results of the exit diameter/incidence diameter, respectively.

As can be understood from FIG. 10, even in case of the processing with respect to the stainless plates, an exit diameter increasing effect was conformed in the above-described "PVA", "vinyl acetate" and "cellulose" according to the present invention, but the exit diameter increasing effect was not obtained in "air (open)" which is Comparative Example.

Comparative Example 5

Formation of a through hole by using a visible laser beam (emitted from a laser equipment Surelite-III manufactured by Continuum) in place of the laser ablation method using an ultraviolet laser beam was considered.
Processing conditions are as follows.
Processing target: a metallic decorative sheet, which is the same as that used in Example 2-3
Application material: a synthetic glue containing polyvinyl alcohol as a main component (which is the same as that used in Example 1)
Applying conditions: a thickness is approximately 100 μm
Applying position: a laser beam exit plane side Laser beam: visible light (a wavelength: 532 nm, a focal length: f=50 mm)

Figure 11:
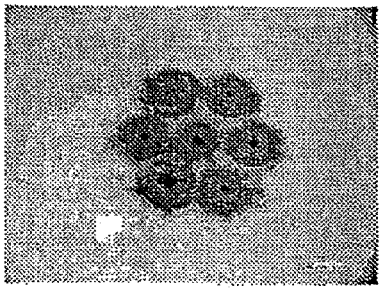
FIG. 11 is microscope photographs of a metallic decorative sheet subjected to laser processing using visible light (Comparative Example 5)
Figure 11:
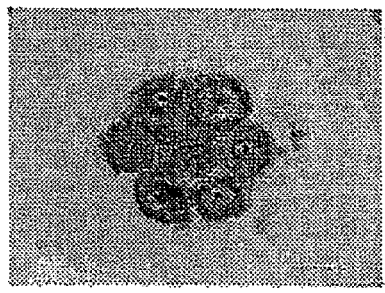
Figure 11:
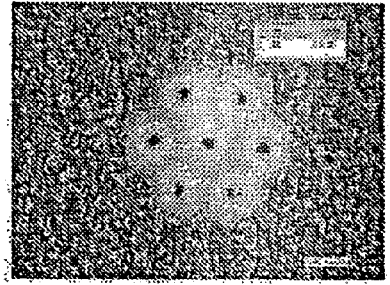
Figure 11:
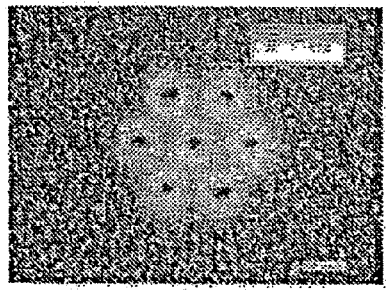

Focal position: a surface of the metallic decorative sheet on an incidence plane side Energy: 100 μJ Pulse width: 5 to 7 ns Number of times of irradiation: 150 times/hole Hole pitch: 100 μm Temperature: an ordinary temperature Pressure: an ordinary pressure Assist gas: none Moreover, a metallic decorative sheet having no synthetic glue applied thereto was processed under the same conditions. FIG. 11 shows results of these examples in the form of microscope photographs of the exit plane side and the incidence plane side of each metallic decorative sheet.

As can be understood from FIG. 11, in the processing using the visible-light laser, a hole diameter of each formed through hole on the exit plane side failed to increase irrespective of presence/absence of application of the synthetic glue containing polyvinyl alcohol as a main component.

Comparative Example 6

Additionally, formation of a through hole by using an infrared laser beam (emitted from the laser equipment Surelite-III manufactured by Continuum) was examined.

Processing conditions are as follows.

Processing target: a metallic decorative sheet, which is the same as that used in Example 2-3

Application material: a synthetic glue containing polyvinyl alcohol as a main component (which is the same as that used in Example 1)

Applying conditions: an application thickness is approximately 100 μm

Applying position: a laser beam exit plane side

Laser beam: infrared light (a wavelength: 1064 nm, a focal length: f=50 mm)

Figure 12:
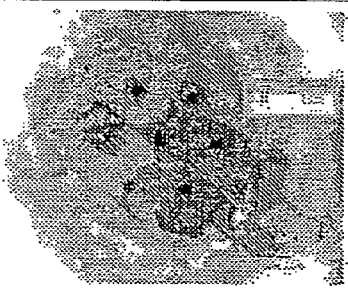
FIG. 12 is a microscope photograph of a metallic decorative sheet (Comparative Example 6) subjected to laser processing using infrared light.
Figure 12:
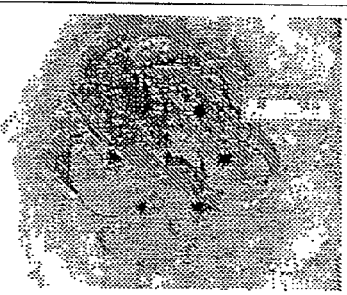
Figure 12:
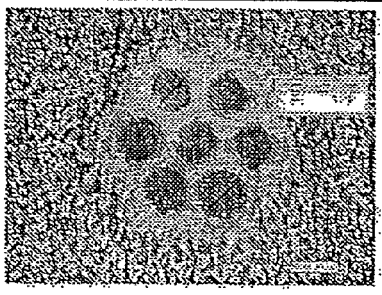
Figure 12:
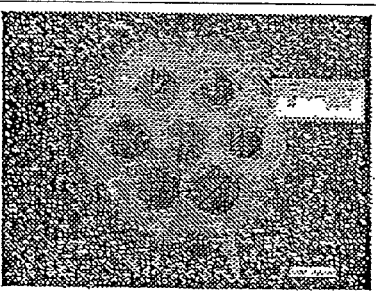
Figure 16:
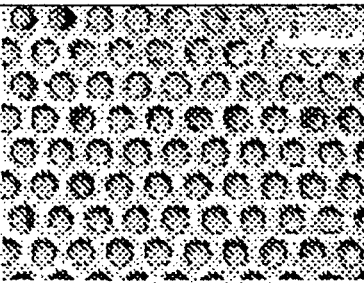
FIG. 16 is a view showing a result in Example 10.
Figure 16:
Figure 16:
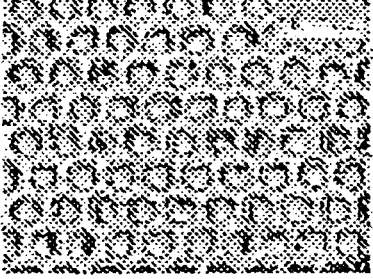
Figure 16:
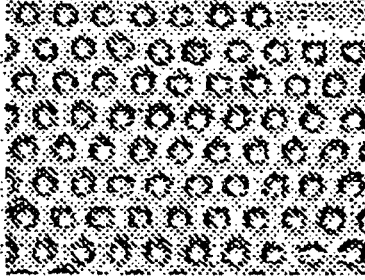

Focal position: a surface of the metallic decorative sheet on an incidence plane side Energy: 600 μJ Pulse width: 5 to 7 ns Number of times of irradiation: 600 times/hole Hole pitch: 100 μm Temperature: an ordinary temperature Pressure: an ordinary pressure Assist gas: none Additionally, a metallic decorative sheet having no synthetic glue applied thereto was processed under the same conditions. FIG. 12 shows results of these examples in the form of microscope photographs of the exit plane side and the incidence plane side of each metallic decorative sheet.

As can be understood from FIG. 12, when the infrared laser was used, a portion near each hole in the exit plane was considerably deteriorated, and a hole diameter of each formed through hole on the exit plane side failed to increase irrespective of presence/absence of application of the synthetic glue containing polyvinyl alcohol as a main component.

Example 10

An aluminum plate having a thickness of 300 μm was subjected to through hole forming processing using a laser. Processing conditions are as follows.

Processing target: an aluminum plate having a thickness of 300 μm

Application materials: no application, benzin (Comparative Example), tap water (Comparative Example), a mixed liquid of ethanol and tap water having a volume ratio of 1:1 (an ethanol aqueous solution) (Comparative Example), methanol (Comparative Example), a mixed liquid of methanol and tap water having a volume ratio of 1:1 (a methanol aqueous solution) (Comparative Example), glycerin (Comparative Example), a mixed liquid of glycerin and tap water having a volume ratio of 2:1 (a glycerin aqueous solution, Example), an aqueous synthetic glue obtained by dissolving polyvinyl alcohol in water (which is used in Example 1, PVA (Example)), an aqueous solution obtained by mixing this aqueous synthetic glue with tap water to provide a ratio of 1:5 (a PVA aqueous solution (Example)), an aqueous solution obtained by dissolving carboxymethylcellulose sodium (1 g) in water (50 mL) ("CM cellulose aqueous solution" (Example)), a hydrogen peroxide solution (a 3% oxydol liquid, Comparative Example)

Applying conditions: an application thickness is approximately 1000 μm

Applying position: a laser beam exit plane side

Laser beam: YLF third harmonic (a wavelength: 349 nm, a focal length: f=200 mm)

Focal position: a surface of the aluminum plate on an incidence plane side

Energy: 100 μJ

Pulse width: 4 to 6 ns

Number of times of irradiation: 4000 times/hole (1 kHz)

Hole pitch: 70 μm

Temperature: an ordinary temperature

Pressure: an ordinary pressure

Assist gas: none

FIGS. 13 to 16 show results of these examples in the form of microscope photographs of the exit plane side and the incidence plane side of each aluminum plate, and these drawings show incidence diameters (average diameters) and exit diameters (average diameters) measured from these photographs and calculation results of the exit diameter/incidence diameter (written as "ratio"), respectively.

As can be understood from FIGS. 13 to 16, in case of processing the aluminum plates having thickness of 300 μm by using the polyvinyl alcohol aqueous solution and its solution diluted with water, glycerin and its aqueous solution and the carboxymethylcellulose sodium aqueous solution according to the present invention, an exit diameter increasing effect was confirmed. But the exit diameter increasing effect was not obtained in case of processing by using benzene, tap water, ethanol and its aqueous solution, methanol and its aqueous solution and the oxydol liquid (the hydrogen peroxide solution) as comparative examples.

Example 11

Consideration was given on through hole forming processing using a laser with respect to an aluminum plate having a thickness of 300 μm with a hole pitch being set to 125 μm. Processing conditions are as follows.

Processing target: an aluminum plate having a thickness of 300 μm

Application materials: no application, ethylene glycol (Example), diglycerol (Example), polyglycerol (n is 10 in Chemical Formula (1)) (Example), methanol (Comparative Example)

Applying conditions: an application thickness is approximately 1000 μm

Applying position: a laser beam exit plane side

Laser beam: YLF third harmonic (a wavelength: 349 nm, a focal length: f=200 mm)

Focal position: a surface of the aluminum plate on an incidence plane side

Energy: 100 μJ

Pulse width: 4 to 6 ns

Number of times of irradiation: 3000 times/hole (1 kHz)

Hole pitch: 125 μm

Temperature: an ordinary temperature

Pressure: an ordinary pressure

Assist gas: none

FIG. 17 shows results of these examples in the form of microscope photographs of the exit plane side and the incidence plane side of each aluminum, and the drawing also shows incidence diameters (average diameters) and exit diameters (average diameters) measured from these photographs and calculation results of the exit diameter/incidence diameter (written as "ratio"), respectively.

As can be understood from FIG. 17, an exit diameter increasing effect was confirmed in the processing with respect to the aluminum plate having the thickness of 300 μm in Examples using the polyols, but the exit diameter increasing effect was not obtained in methanol as Comparative Example.

Example 12

A processing test was conducted with respect to a black polycarbonate plate (Excure manufactured by SP Pacific Ltd.). Processing conditions are as follows.

Processing target: a polycarbonate plate (Excure manufactured by SP Pacific Ltd.) having a thickness of 180 μm Application materials: no application, ethylene glycol (Example), diglycerol (Example), polyglycerol (n is 10 in Chemical Formula (I)) (Example)

Applying conditions: a thickness is approximately 1000 μm

Applying position: a laser beam exit plane side

Laser beam: YLF third harmonic (a wavelength: 349 nm, a focal length: f=200 mm)

Focal position: a surface of the polycarbonate plate on an incidence plane side

Energy: 100 μJ

Pulse width: 4 to 6 ns

Number of times of irradiation: 500 times/hole (1 kHz)

Hole pitch: 125 μm

Temperature: an ordinary temperature

Pressure: an ordinary pressure

Assist gas: none

Figure 18:
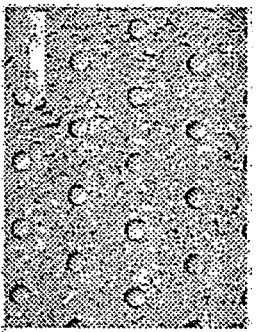
FIG. 18 is a view showing a result in Example 12.

FIG. 18 shows results of these examples in the form of microscope photographs of the exit plane side and the incidence plane side of each polycarbonate plate, and the drawing also shows incidence diameters (average diameters) and exit diameters (average diameters) measured from these photographs and calculation results of the exit diameter/incidence diameter (written as "ratio"), respectively.

As can be understood from FIG. 18, an exit diameter increasing effect was confirmed in the processing with respect to each polycarbonate plate having the thickness of 180 μm in examples using polyols.

Example 13

A processing test was conducted with respect to a black polycarbonate plate (Excure manufactured by SP pacific Ltd.) with a hole pitch being set to 70 μm. Processing conditions are as follows.

Processing target: a polycarbonate plate (Excure manufactured by SP Pacific Ltd.) having a thickness of 180 μm Application materials: no application, glycerin (Example), an aqueous solution obtained by dissolving carboxymethylcellulose sodium (1 g) in water (50 mL) ("CM cellulose" (Example))

Applying conditions: an application thickness is approximately 1000 μm

Applying position: a laser beam exit plane side

Laser beam: YLF third harmonic (a wavelength: 349 nm, a focal length: f=200 mm)

Focal position: a surface of the polycarbonate plate on an incidence plane side

Energy: 100 μJ

Pulse width: 4 to 6 ns

Number of times of irradiation: 500 times/hole (1 kHz)

Hole pitch: 70 μm

Temperature: an ordinary temperature

Pressure: an ordinary pressure

Assist gas: none

Figure 19:
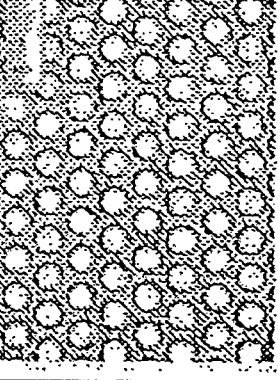
FIG. 19 is a view showing a result in Example 13.

FIG. 19 shows results of these examples in the form of microscope photographs of the exit plane side and the incidence plane side of each polycarbonate plate, and this drawing also shows incidence diameters (average diameters) and exit diameters (average diameters) measured from these photographs and calculation results of the exit diameter/incidence diameter (written as "ratio"), respectively.

As can be understood from FIG. 19, an exit diameter increasing effect can be confirmed in the processing with respect to the polycarbonate plates each having the thickness of 180 μm in Examples using the polyols or the aqueous solution of the high-polymer material according to the present invention.

It is to be noted that benzin, tap water, ethanol and methanol were likewise applied and examined, but a sufficient increase in exit diameter was not observed, or hole shapes were awkward and sizes were not uniform even though the increasing effect was obtained.

Further, in FIG. 19, a sample to which the carboxymethylcellulose sodium aqueous solution was applied to be processed (corresponding to an actual size 0.71 mm×0.57 mm in this microscope photograph) has a hole area rate (an exit hole area rate) of 65.2%.

Here, there was no hole formed artifact in which a hole formed portion having holes with a diameter of 100 μm or below that cannot be usually visually confirmed in conventional examples has a hole area rate (a hole area rate in a region of a square having each side whose length is 0.3 mm or above) of 35% or above. Such a hole formed artifact has a very high light transmission ratio (there is almost no light loss in terms of functionality). Here, a square in which each side has a length of 0.3 mm is a minimum region utilized as a display in which a vertical bar and a horizontal bar each formed of a light beam visually having a width of 0.1 mm can be discriminated from each other, and a hole area rate of a square region in which each side has a length of 0.5 mm or above is preferably 35% or above.

Further, in the above description, a hole diameter in the exit plane is 59.6 μm. Since this is processing of forming a hole having a diameter of 59.6 μm with respect to a board thickness of 180 μm, it is processing with an aspect ratio 3 (board thickness/hole diameter). Generally, in hole forming processing using a punching press, processing with a hole diameter smaller than a board thickness, i.e., processing with an aspect ratio of 1 or above is difficult, whereas the present invention can realize hole forming processing with a hole area rate of 65% or above and an aspect ratio of 3 or above.

Example 14

A processing test was conducted with respect to a black polycarbonate plate (Upilon manufactured by Mitsubishi Engineering-Plastics Corporation) having a thickness of 300 μm. Processing conditions are as follows.
Processing target: a polycarbonate plate (Upilon manufactured by Mitsubishi Engineering-Plastics Corporation) having a thickness of 300 μm
Application materials: no application, ethylene glycol (Example), diglycerol (Example), polyglycerol (n is 10 in Chemical Formula (1)) (Example)
Applying conditions: an application thickness is approximately 1000 μm
Applying position: a laser beam exit plane side
Laser beam: YLF third harmonic (a wavelength: 349 nm, a focal length: f=200 mm)
Focal position: a surface of the polycarbonate plate on an incidence plane side
Energy: 100 μJ
Pulse width: 4 to 6 ns
Number of times of irradiation: 500 times/hole (1 kHz)
Hole pitch: 125 μm
Temperature: an ordinary temperature
Pressure: an ordinary pressure
Assist gas: none
FIG. 20 shows results of these examples in the form of microscope photographs of the exit plane side and the incidence plane side of each polycarbonate plate, and the drawing also shows incidence diameters (average diameters) and exit diameters (average diameters) measured from these photographs and calculation results of the exit diameter/incidence diameter (written as "ratio"), respectively.
As can be understood from FIG. 20, in the examples using the polyols according to the present invention, an exit diameter increasing effect was confirmed in the processing for the polycarbonate plate having the thickness of 300 μm.

Example 15

Figure 21:
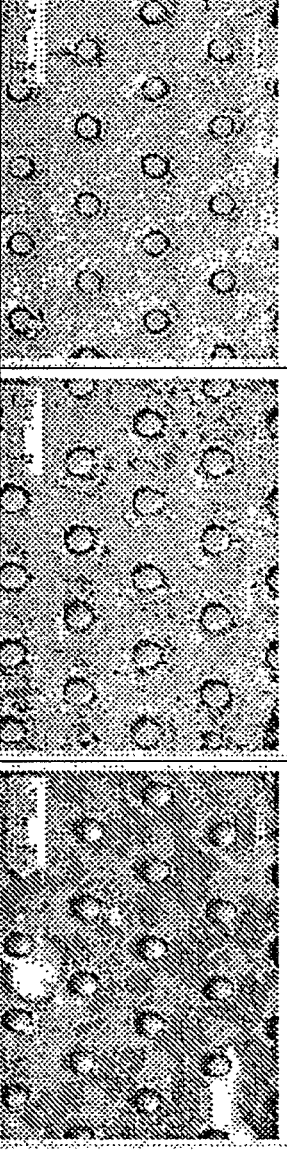
FIG. 21 is a view showing a result in Example 15.

A processing test was conducted with respect to a black polybutylene terephthalate plate (Valox manufactured by SABIC Polymerland). Processing conditions are as follows.
Processing target: a polybutylene terephthalate plate (Valox manufactured by SABIC Polymerland) having a thickness of 250 μm
Application materials: no application, diglycerol (Example), polyglycerol (n is 10 in Chemical Formula (1)) (Example)
Applying conditions: a thickness is approximately 1000 μm
Applying position: a laser beam exit plane side
Laser beam: YLF third harmonic (a wavelength: 349 nm, a focal length: f=200 mm)
Focal position: a surface of the polybutylene terephthalate plate on an incidence plane side
Energy: 100 μJ
Pulse width: 4 to 6 ns
Number of times of irradiation: 500 times/hole (1 kHz)
Hole pitch: 125 μm
Temperature: an ordinary temperature
Pressure: an ordinary pressure
Assist gas: none
FIG. 21 shows results of these examples. In the examples using the polyols according to the present invention, an exit diameter increasing effect was confirmed in the processing for the polybutylene terephthalate plate having the thickness of 250 μm. Further, the incidence hole diameter also differs depending on polyol to be used, and not only the exit hole diameter but also the incidence hole diameter can be adjusted by utilizing the polyols.

Example 16

Figure 22:
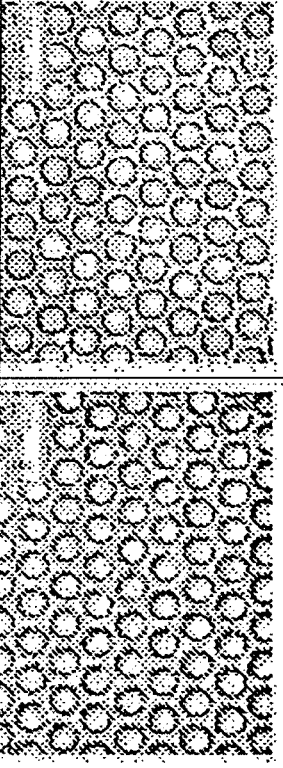
FIG. 22 is a view showing a result in Example 16.

A processing test was conducted with respect to a black polybutylene terephthalate plate (Valox manufactured by SABIC Polymerland) with a hole pitch being set to 70 μm. Processing conditions are as follows.
Processing target: a polybutylene terephthalate plate (Valox manufactured by SABIC Polymerland) having a thickness of 250 μm
Application materials: no application, glycerin (Example), an aqueous solution obtained by dissolving carboxymethylcellulose sodium (1 g) in water (50 mL) ("CM cellulose" (Example))
Applying conditions: an application thickness is approximately 1000 μm
Applying position: a laser beam exit plane side
Laser beam: YLF third harmonic (a wavelength: 349 nm, a focal length: f=200 mm)
Focal position: a surface of the polybutylene terephthalate plate on an incidence plane side
Energy: 100 μJ
Pulse width: 4 to 6 ns
Number of times of irradiation: 500 times/hole (1 kHz)
Hole pitch: 70 μm
Temperature: an ordinary temperature
Pressure: an ordinary pressure
Assist gas: none
FIG. 22 shows results of these examples in the form of microscope photographs of the exit plane side and the incidence plane side of each polybutylene terephthalate plate, and the drawing also shows incidence diameters (average diameters) and exit diameters (average diameters) measured from these photographs and calculation results of the exit diameter/incidence diameter (written as "ratio"), respectively.
As can be understood from FIG. 22, in the examples using the polyols according to the present invention, an exit diameter increasing effect was confirmed in the processing for the polybutylene terephthalate plate having the thickness of 250 μm, and it can be comprehended that a hole area rate is as high as 45% or above in these examples. It is to be noted that benzin, tap water, ethanol and methanol were likewise applied and examined, but a sufficient increase in diameter was not observed, or hole shapes were awkward and sizes were not uniform even though the increasing effect was obtained.

Example 17

A processing test for a titanium plate was conducted with a hole pitch being set to 70 μm. Processing conditions are as follows.

Processing target: a titanium plate having a thickness of 300 μm

Application materials: no application, tap water, starch glue (a commercially available starch glue which is Home Glue manufactured by Mitue Co., Ltd.) (Example), an aqueous solution obtained by dissolving carboxymethylcellulose sodium (2.5 g) in water (50 mL) ("CM cellulose" (Example))

Applying conditions: an application thickness is approximately 1000 μm

Applying position: a laser beam exit plane side

Laser beam: YLF third harmonic (a wavelength: 349 nm, a focal length: f=200 mm)

Focal position: a surface of the titanium plate on an incidence plane side

Energy: 100 μJ

Pulse width: 4 to 6 ns

Number of times of irradiation: 3000 times/hole (1 kHz)

Hole pitch: 125 μm

Temperature: an ordinary temperature

Pressure: an ordinary pressure

Assist gas: none

FIG. 23 shows results of these examples in the form of microscope photographs of the exit plane side and the incidence plane side of each titanium plate, and this drawing also shows incidence diameters (average diameters) and exit diameters (average diameters) measured from these photographs and calculation results of the exit diameter/incidence diameter (written as "ratio), respectively.

As can be understood from FIG. 23, in the examples using the colloid solution of the high-polymer material and the aqueous solution of the high-polymer material according to the present invention, an exit diameter increasing effect was confirmed in the processing for the titanium plate having the thickness of 300 μm.

As described above, according to the present invention, when one or more materials selected from the colloid solution of the high-polymer material, the solution of the high-polymer material and polyol are applied to the laser beam exit plane side of the processing target and the through hole forming processing using the laser is performed while controlling a laser energy amount and the number of times of irradiation in accordance with a thickness or a material of the processing target, each through hole can be formed in the processing target while being adjusted to have a tapered shape, a straight shape or an inverse tapered shape. Further, when the third harmonic, the fourth harmonic or the fifth harmonic in the ultraviolet light or the excimer laser beam is used as the laser beam, through holes having the tapered shape, the straight shape or the inverse tapered shape can be formed in a very dense state based on the laser ablation phenomenon, and the plurality of (many) through holes can be simultaneously and collectively processed if the excimer laser is used, thereby reducing a processing time. Furthermore, when the laser energy amount and the number of times of irradiation are controlled, the processing can be carried out with an energy amount that is a half of that in an example where the colloid solution of the high-polymer material or the solution of the high-polymer material is not applied, which is economical.

Moreover, after the processing using the laser, when the applied colloid solution of the high-polymer material or the applied solution of the high-polymer material is cleaned by using a disperse medium or a solvent and then subjected to filtration, condensation, collection and others, a dispersed material, a dissolved substance, the disperse medium and the solvent can be recycled. The laser processing can be performed without producing waste materials as much as possible, thus making products considering an environment for the occasion.

Additionally, since the colloid solution of the high-polymer material, the solution of the high-polymer material or polyol (or an aqueous solution of polyol) has a liquid form, such a material can cope with various shapes of an exit plane side of a processing target, a freedom degree of design is thereby high, and the freedom degree of design can be further increased based on contact using application.

The present invention can be extensively applied to a processing target without regard to transparency/opacity, various kinds of resin materials, various kinds of laminated materials including a metal layer, or metallic materials such as aluminum or stainless.

As an application of the above-described examination, in a hole formed artifact having many through holes with a diameter of 100 μm or below formed therein, the hole forming processing can be carried out under conditions that a ratio of diameters of each hole in two planes falls within a range between 100:75 and 75:100 (including a boundary value) by previously conducting the examination as described above, and a pitch between the holes can be further reduced, whereby a hole area rate can be improved to, e.g., 50% or above.

INDUSTRIAL APPLICABILITY

According to the through hole forming method of the present invention, when a hole diameter of each through hole formed on the exit plane side is arbitrarily increased or reduced, each through hole can be adjusted to have a tapered shape, a straight shape or an inverse tapered shape, and the through holes can be processed in a very dense state, whereby applications can be carried out in all aspects from domestic products to industrial products, for example, enabling processing that can provide unique functionality such as weight saving or inhibition of transmission of water droplets and allowance of transmission of moisture vapor through a resin or provide unique decorativeness that can silhouette against light applied from a back surface even though holes are seemingly not formed.

The invention claimed is:

1. A method for forming a through hole by using a laser ablation method, which forms the through hole at a work object by radiating a laser beam from a laser beam machining device to the work object so as to sublimate a part of the work object, comprising the steps of:
    selecting at least one material from a group of a flowable colloid solution of a polymer, a solution of a polymer, and a fluid polyol;
    arranging the selected at least one material in contact with a laser beam exit surface of the work object; and
    radiating the laser beam to a surface of the work object opposite to the laser beam exit surface, wherein
    the selected at least one material is in a flowable liquid form and is arranged at a thickness of 50 to 2000 μm.

2. The method according to claim 1, wherein the flowable colloid solution of the polymer is selected from the group consisting of a starch solution, polyvinyl acetate emulsion, a natural rubber-based latex, an acrylic latex, a polyurethane-based latex, or a synthetic rubber-based latex and a combination thereof.

3. The method according to claim 1, wherein the solution of the polymer is selected from the group consisting of an aqueous solution of a polyvinyl alcohol, an aqueous solution of a polymer of acrylic acid, an aqueous solution of a polyacrylamide, an aqueous solution of a polyethylene oxide, an aqueous solution of carboxymethylcellulose sodium or methylcellulose, and a solution of cellulose nitrate in an organic solvent.

4. The method according to claim 1, wherein the fluid polyol is selected from the group consisting of ethylene glycol, glycerin, diglycerol, and polyglycerol.

5. The method according to claim 1, wherein the laser beam is ultraviolet light.

6. The method according to claim 1 or 5, wherein the laser beam is by any one selected from a group of a Q-switched pulse YAG laser, a Q-switched pulse YLF laser and a Q-switched pulse $YVO_4$ laser.

7. The through hole forming method according to claim 1 or 5, wherein the laser beam is by an excimer laser.

8. The method according to claim 1 or 5, wherein the laser beam is one selected from a group of a third harmonic wave, a fourth harmonic wave and a fifth harmonic wave of a solid laser.

9. The method according to claim 8, wherein the laser beam is by any one selected from a group of a Q-switched pulse YAG laser, a Q-switched pulse YLF laser and a Q-switched pulse $YVO_4$ laser.

* * * * *